United States Patent [19]

Van Antwerp

[11] Patent Number: 4,908,527
[45] Date of Patent: Mar. 13, 1990

[54] HALL-TYPE TRANSDUCING DEVICE
[75] Inventor: Joel C. Van Antwerp, Frisco, Tex.
[73] Assignee: Xolox Corporation, Fort Wayne, Ind.
[21] Appl. No.: 241,589
[22] Filed: Sep. 8, 1988
[51] Int. Cl.[4] .................... H03K 17/97; H03K 17/90
[52] U.S. Cl. ............................ 307/309; 307/310;
307/491; 324/235; 324/251; 338/32 H; 357/27
[58] Field of Search ............... 307/309, 310, 491, 494,
307/278, 515; 357/27; 328/3, 5; 338/32 R, 32
H; 324/224, 225, 235, 251

[56] References Cited
U.S. PATENT DOCUMENTS

| | | | |
|---|---|---|---|
| 3,671,767 | 6/1972 | Davis | 307/309 |
| 3,816,766 | 6/1974 | Anselmo et al. | 307/278 |
| 3,823,354 | 7/1974 | Janssen . | |
| 4,123,772 | 10/1978 | Janssen | 357/27 |
| 4,134,030 | 1/1979 | Pace | 307/309 |
| 4,141,026 | 2/1979 | Bate | 357/27 |
| 4,371,837 | 2/1983 | Sieverin | 307/309 |
| 4,374,333 | 2/1983 | Avery | 307/309 |
| 4,395,695 | 7/1983 | Nakamura | 338/32 H |
| 4,578,698 | 3/1986 | Miki et al. | 358/22 |
| 4,705,964 | 11/1987 | Higgs | 307/309 |
| 4,734,594 | 3/1988 | Nelson | 307/309 |
| 4,761,569 | 8/1988 | Higgs | 307/309 |

Primary Examiner—John Zazworsky
Attorney, Agent, or Firm—Pearne, Gordon, McCoy & Granger

[57] ABSTRACT

A transducer in the form of an integrated circuit comprising a Hall cell, first and second differential amplifiers, an output driver stage, a threshold voltage-generating circuit between said amplifiers, and a control circuit for selectively enabling and disabling the threshold voltage-generating circuit. The second amplifier provides an output signal representative of the enabled-disabled condition of the threshold voltage-generating circuit. A permanent magnet having a temperature coefficient is movable with respect to the transducer between given field-applying and field-removing positions. The transducer operates to change switching states between "operate" and "release" in response to the two different levels of applied magnetic fields, respectively, resulting from the two given operating positions of the magnet. The transducer also has a temperature coefficient at its "operate" point which substantially tracks that of the magnet, thereby rendering the transducer operation essentially independent of ambient temperature changes.

43 Claims, 10 Drawing Sheets

SECOND AMPLIFIER 20

4,908,527

HALL-TYPE TRANSDUCING DEVICE

BACKGROUND OF THE INVENTION

The present invention relates to Hall-type transducing devices embodied in monolithic integrated circuits.

It is known to incorporate a Hall element along with other semiconductor components, such as an amplifier and switching circuit, into a single silicon-integrated circuit commonly referred to as a "chip," and to utilize the chip for the purpose of determining the presence of a magnetic field. Devices of the type are described in Anselmo et al. U.S. Pat. No. 3,816,766, issued June 11, 1974; in Avery U.S. Pat. No. 4,374,333, issued Feb. 15, 1983; and in Janssen U.S. Pat. No. 4,123,772, issued Oct. 31, 1978. It is also known that such intergrated circuits, as well as the components therein, have electrical characteristics that vary with changes in temperature. When these chips are used for the purpose of measuring the level of a particular strength field, care must be taken to assure that the ambient temperature is constant. Also, when these chips are used to detect the presence of a permanent magnet spaced a given distance therefrom the same constant temperature condition must be maintained as to the magnet also.

Transducing devices have employed actuating magnets capable of producing relatively strong fields in order to cope with the reduced strength of the magnets at relatively high temperatures. High temperature considerations, therefore, have determined the minimum magnet strength, and this in turn has determined the minimum physical size of the magnet: the larger the magnet, the stronger the field.

In the present invention, it is desired to employ relatively low energy magnet material, such as ferrite powder, in a plastic matrix as the actuating magnet. In the usual case, in order to obtain a sufficiently high energy output or field strength at high temperatures, the ferrite magnet must be large physically; hence, this material normally is not suitable for those applications in which space is limited.

SUMMARY OF THE INVENTION

In designing a Hall-type transducer to operate in conjunction with a comparatively small, ferrite-composite magnet, between "ON" and "OFF" states over a wide range of temperatures, it is necessary to assure that transducer switching sensitivity is always adequate to cause actuation.

In the overall circuit operation, it is necessary to obtain a switching action each time the actuating magnet, usually a permanent magnet, is moved between first and second positions relative to the Hall cell, each of these positions being fixed distances from the Hall cell. In the first position, the magnet is proximal to the Hall cell such that a maximum strength field is imposed thereon. The second position is spaced from the Hall cell sufficiently to remove the field. If desired, a further operation may be achieved by moving the magnet to a third position in which the opposite and equal strength pole of the magnet is disposed congruently with the first position.

It is desired that charge-of-state switching of the transducer be effected when the magnet pole is moved to the fixed distance of the first and second positions, respectively, throughout a temperature range of, for example, $-40°$ C. to $+150°$ C. In order to achieve this objective, it is necessary to take into consideration the variations in ambient temperature as they affect performance of both the magnet and integrated circuit, and also processing variables and stress gradients as they affect the integrated circuit itself. The temperature coefficients, therefore, of both the magnet and integrated circuit must track as closely as possible so that each time the magnet is disposed the aforesaid fixed distances from the Hall cell, the desired switching action occurs irregardless of changes in ambient temperature.

The circuitry itself comprises a Hall cell, an amplifier therefor having an output circuit which provides a threshold voltage for a succeeding second amplifier, and an output driver responsive to the second amplifier output to produce a change-of-state ("ON"/"OFF") signal.

The design is executed utilizing differential techniques throughout the signal path for high common mode rejection. As an added precaution, the input signal to the output driver stage is delayed to ensure that magnetic hysteresis is fully engaged before the output driver can change states. Generally speaking, the design features of this invention are so related as to maximize yield of chips in repeated production runs.

It is an object of this invention to provide a Hall effect transducer in the form of an integrated circuit of semiconductive material, which is stable in operation under conditions of varying ambient temperature.

It is another object of this invention to provide a Hall-type transducer in the form of an integrated circuit which is so arranged both as to geometric layout and circuit configuration as to maximize yield in the production of stable operating chips.

It is still another object of this invention to provide a Hall-type transducer having a temperature coefficient which substantially tracks the temperature coefficient of an operating magnet.

DESCRIPTION OF THE PREFERRED EMBODIMENT

Figure 1:
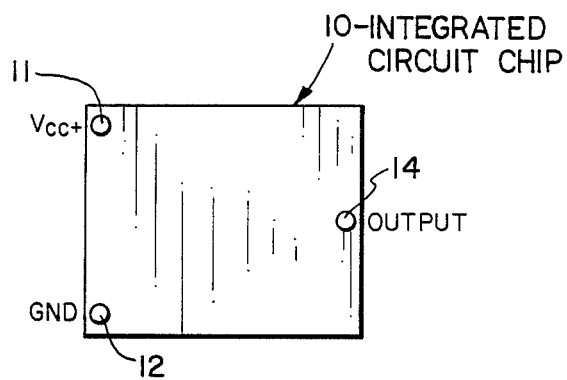
FIG. 1 is a plan view of an integrated circuit chip of this invention.

FIG. 1 is a top view representative of the monolithic integrated circuit transducer 10, sometimes "chip," of this invention, and is provided with three terminals 11, 12, and 14 for connection to external circuitry. The circuit is fabricated basically of silicon suitably doped using the standard bipolar process. The transducer is a linear bipolar integrated circuit which is formed on or in the chip.

The transducer circuit is shown in FIG. 1 (FIGS. 2A-2D), and generally comprises a voltage regulator section 16, a Hall cell, and a first amplifier section 18, a second, high gain amplifier or voltage comparator section 20, and an output driver section 22.

Figure 1A:
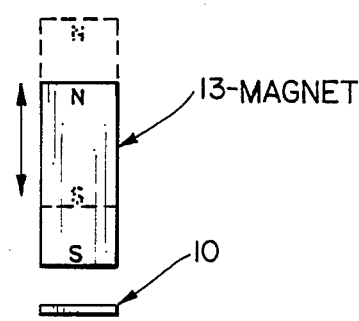
FIG. 1A is a diagrammatic side view of a magnet and transducer combination used in explaining the invention.

Referring to FIG. 1A, the chip or transducer 10 is shown relative to two possible operating positions of an actuating, permanent magnet 13. These components are not to scale, and are exaggerated in size for clarity of illustration. The transducer 10 contains the circuit of FIG. 2 (FIGS. 2A-2D). The magnet 13, in one embodiment, is of the low energy variety, being fabricated of relatively low energy magnetic material, such as ferrite powder, in a plastic matrix. It is suitably mounted for movement between the full-line and dashed-line positions, the full-line position being that at which the south pole is located proximate to the transducer 10 in the first position so as to apply thereto, for example, one hundred gauss and the dashed-line position being that at which the field applied is essentially zero gauss. The transducer 10 functions as a switch having two operating states, one being "ON" and the other "OFF." As will later appear, when the magnet 13 is in its first position, the transducer will be actuated to an "ON" state.

Figure 7:
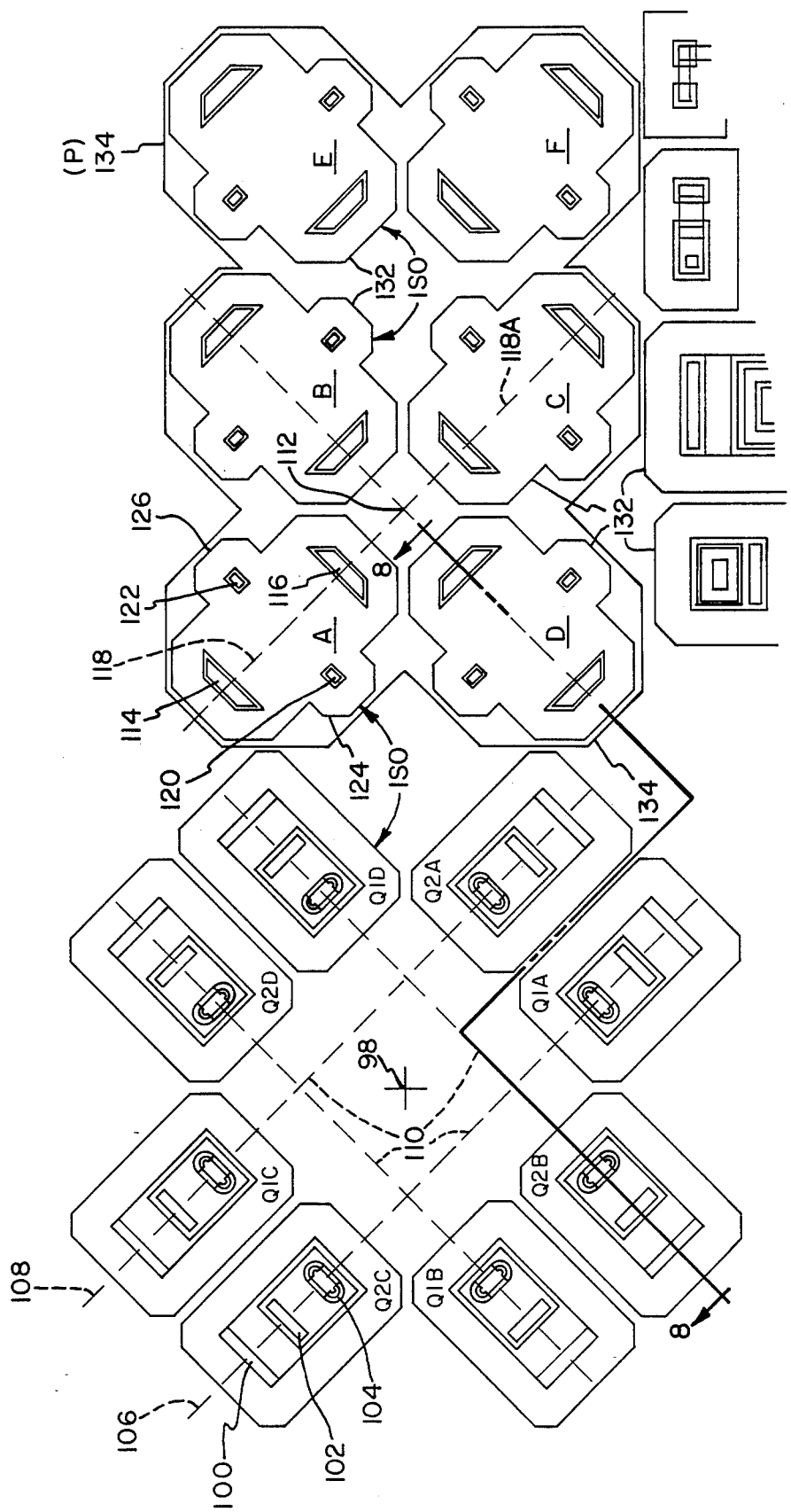
FIG. 7 is a top plan view of a portion of the chip showing the placement and geometry of the first amplifier transistors and the sensing and auxiliary Hall elements.
Figure 8:
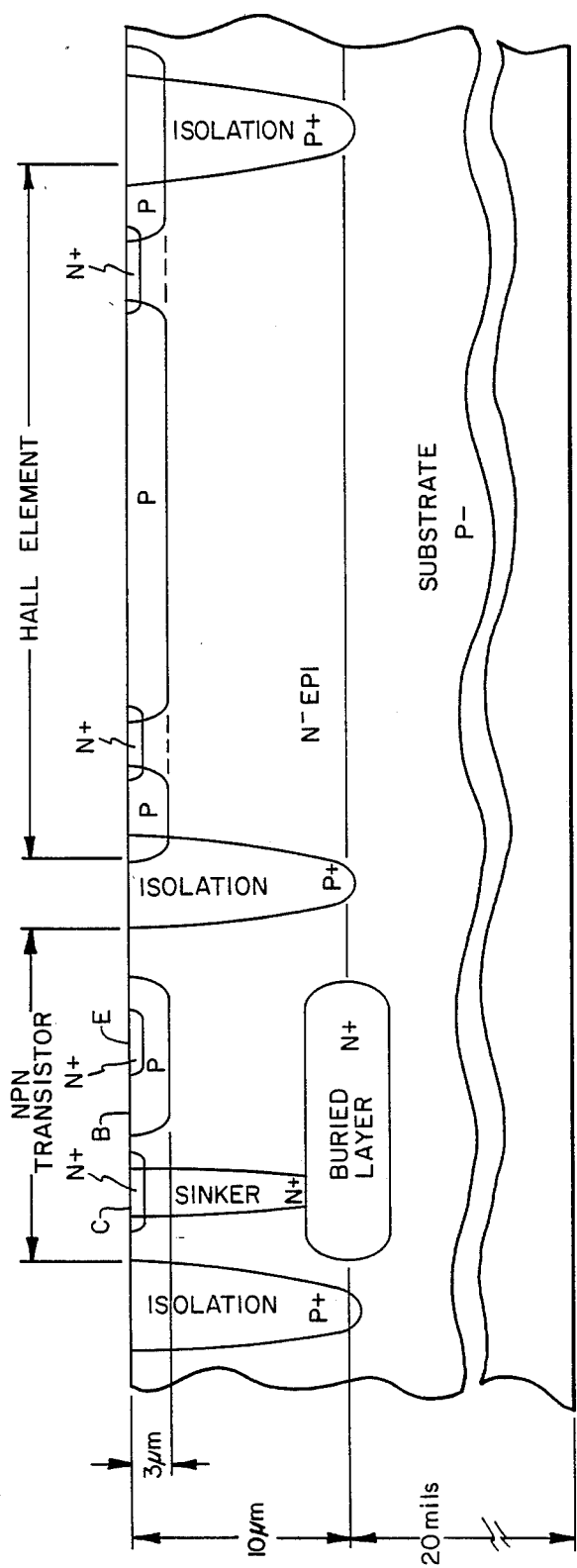
FIG. 8 is a sectional view taken substantially along section line 8—of FIG. 7.

The integrated circuit is monolithic and is formed basically of silicon material using the standard bipolar process. With reference to FIGS. 7 and 8, the order of processing the various layers will be noted in connection with a more specific description of one Hall element and an NPN transistor. For one embodiment, on a substrate of an acceptor-doped P material is diffused the buried layer of donor-doped N material, followed by growth of an epitaxial layer of donor-doped N material, the sinker diffusion of donor-doped N material, the base diffusion of P material, the implant resistance of boron, the ohmic contacts, the metallization and suitable passivation. The substrate has a thickness of about 20 mils, the epilayer 10 microns, and the P base diffusion three microns. The substrate resistivity is eight ohmcentimeters, and the epilayer has a resistivity of about four ohm-centimeters. The P base diffusion has a sheet resistance of 200 ohms per square, and the implant layer a sheet resistance of 2000 ohms per square.

The beta range of the NPN transistors is from 80 to 320. The lateral PNP transistors should have a minimum beta of 10.

Each of the epilayer Hall elements A-F (FIG. 7) and the transistors is surrounded on the sides by an isolating region 132 of acceptor-doped P conductivity type material, as further shown in FIG. 8. The base diffusion layer 134 of P conductivity type material overlies the epilayer, as shown, and is provided with windows for the ohmic contacts of donor-doped N conductivity-type material. The NPN transistor embodies buried and sinker layers of conventional form.

Referring to FIG. 2 (FIGS. 2A -2D), the Hall cell 24, composed of four Hall elements in quadrature relation, is connected between regulated positive and negative voltage busses 26 and 28, but in series with a diode 30 and a resistor 32. The voltage output terminals of the Hall cell are connected to the bases, respectively, of gang-connected transistors Q1 and Q2, in quadrature relation in the chip, the collectors of these transistors being series-connected with load resistors to the positive voltage buss 26. In the circuit of the collector of the transistor Q1 are two series-connected resistors 34 and 36. In the collector circuit of the transistor Q2 are matched series resistors 38 and 40, 34 and 38 being of identical resistance (in a working embodiment 61.5 ohms), and 36 and 40 also being identical (10,000 ohms). Two diodes Q3 and Q4 are connected in opposed polarity between the two collectors of transistors Q1 and Q2, as shown.

Between the interconnected emitters of transistors Q1 and Q2 and the ground buss 28 is the transistor Q12 and resistor 42 which serves as a constant circuit sink. The base of transistor Q12 has a temperature variable bias voltage applied thereto by connections from the resistor divider composed of series-connected resistors 44 and 46 connected between the regulated positive and negative voltage busses 26 and 28 and the interconnected components comprising transistors Q9 and Q10.

The collector of transistor Q10 is connected to the positive voltage supply buss 26 and the emitter to the base of the transistor Q12 and the anode of the diode Q11. The cathode of this means of resistor 29. The transistor Q9 has its collector connected to the base of the transistor Q10 and also to the junction of the two resistors 44 and 46. The emitter of this transistor Q9 is connected to the negative voltage buss 28 by means of resistor 31.

The circuit of transistors Q1 and Q2 is configured as a differential amplifier to have limited but variable voltage gain (in a working embodiment a gain of about 18 at room temperature). The respective collectors of transistors Q1 and Q2 are connected to the bases of emitter followers Q5 and Q6 which, respectively, and series-connected with diodes Q7 and Q8, and constant current sink transistors Q13 and Q14, respectively, between the regulated positive and negative voltage busses 26 and 28. The bases of transistors Q12, Q13, and Q14 are connected together. Resistors 48 and 50 are connected in series between negative buss 28 and the respective emitters of transistors Q13 and Q14.

The emitter circuits at the cathodes of diodes Q7 and Q8 of the emitter followers Q5 and Q6 are connected, respectively, to a first stage of differential amplifier Q19 and Q20 configured to provide essentially a gain of thirty-five (35). The collectors of Q19 and Q20 are connected to the positive buss 26 by means of resistors 52 and 54, respectively, while the emitters are connected together and to the negative voltage buss 26 by means of a constant current sink transistor Q34. The output terminals, the collectors, of the differential amplifier Q19 and Q20 are connected to the bases of two emitter follower transistors Q23 and Q24, respectively, the emitters of each of these being connected to the negative voltage buss 28 by means of individual constant current sinks Q35 and Q36. The emitters of transistors Q23 and Q24 are, respectively, connected to the bases of a second stage of differential amplifier Q25 and Q26, respectively, of the second amplifier section 20, typically having a gain of thirty-five (35), the collectors being connected to the positive voltage buss 26 by means of load resistors 56 and 58, and the emitters to the negative voltage buss 28 via a constant current sink transistor Q37. The output terminals, collectors, of this differential amplifier Q25 and Q26 are also connected to emitter followers in the form of transistors Q29 and Q30, as shown, these two being connected to the negative voltage buss 28 via constant current sink transistors Q38 and Q39, respectively. Taken together, these two stages Q19, Q20 and Q25, Q26 compose a second amplifier or voltage comparator 20 (see FIG. 5) with a gain of about one thousand two hundred twenty-five (1225). Back-to-back diodes Q21, Q22, and Q27, Q28 are connected between the collectors of both the differential amplifier circuits Q19, Q20 and Q25, Q26, respectively, and serve to keep the respective stage from saturating. The output terminals of the emitter followers Q29 and Q30 at the emitters thereof are indicated by the numerals 75 and 76, these terminals being connected, respectively, to negative buss 28 by current sinks Q38 and Q39, respectively. These terminals 75 and 76 are connected to the bases of the PNP transistors of another differential amplifier Q206 and Q207 in the output driver section 22 (see FIG. 6) via series connected resistors 60 and 62. The emitters of these two PNP transistors Q206, Q207 are connected together and to the positive voltage buss 26 via transistor Q203, and the collectors to the negative voltage buss 28 via the two transistors Q208 and Q209. It will be noted that the base bias for these two transistors Q208 and Q209 is provided by the connection to the collector of transistor Q208.

PNP transistor 203 has four collector elements, two of these being interconnected and to the base, one to the emitters of NPN transistors Q206 and Q209 and the remaining one to the collectors of transistor Q204 and Q210. The emitter of transistor Q203 is connected to the positive voltage buss 26 by means of a degeneration resistor. The base of PNP transistor Q203 is connected to the base of PNP transistor Q201 which has its emitter connected to positive voltage buss 26 by means of a matched degeneration resistor and its collector connected to the collector of current sink transistor Q200. The emitter of transistor 200 is connected to the negative voltage buss 28. PNP transistor Q202 has its base connected to the collector of transistor Q201 and its emitter connected to the bases of transistors Q201 and Q203.

The output terminal of the amplifier composed of transistor Q207 is at the collector of the transistor Q207 and leads to the base of transistor Q210, which is series-connected with PNP transistor Q204 and between the positive and negative busses 26 and 28, as shown. The emitter of transistor Q204 is connected to the positive voltage buss 26 by means of resistor 64. The output terminal of the transistor Q210 is the collector which leads to the base of transistor Q211, which is series-connected with load resistor 66 and transistor Q205 between the unregulated positive voltage buss 68 and the negative voltage buss 28.

The output terminal of the transistor Q211 is the collector which leads to the base of transistor Q212, the emitter leading to the negative voltage buss 28. The collector of transistor Q212 may be connected to the unregulated voltage buss 68 by means of an external resistive load.

The bases of current sink transistors Q34, Q35, Q36, Q37, Q38, Q39, and Q200 are connected together and the emitters to the negative voltage buss 28. Transistor Q32 is series-connected with diode Q33 between the positive and negative voltage busses 26 and 28, the collector of transistor to the buss 26 and the cathode of diode Q33 to buss 28. The base of transistor Q32 is connected to the junction of two series-connected resistors 70 and 72 which are connected between the positive and negative voltage busses 26 and 28. Another transistor Q31 has its collector connected to the base of transistor Q32, its base to the anode of diode Q33 and emitter of transistor Q32, and its emitter to negative voltage buss 28.

THRESHOLD VOLTAGE-DETERMINING CIRCUIT

A current-switching or current-steering circuit, including the transistors Q15, Q16, Q17, and Q18 in a balanced, differential amplifier configuration, is connected between the output points 75 and 76 and the collector circuits of the transistors Q1 and Q2. In the differential amplifier configuration, the two transistors Q15 and Q16 constitute one side and the transistors Q17 and Q18 the other side. Transistors Q15 and Q18 are connected directly to the regulated positive voltage buss 26. The collector of the transistor Q16 is connected to the junction of the two resistors 34 and 36. The collector of the transistor Q17 is similarly connected to the juncture of the two resistors 38 and 40. The bases of transistors Q15 and Q16 are connected together, as are the bases of transistors Q17 and Q18. The emitters of the transistors Q15, Q17, and Q18 are commonly connected to a current sink circuit connected to the ground buss 28, this current sink circuit including the transistors QT1, QT2, QT3, QT4, and QTC. It will be noted that the base and emitter elements of the transistor Q16 are connected together, this representing one embodiment of the invention, which by means of this connection renders the device sensitive to the presence and absence, respectively, of only a single magnetic pole; thus, this embodiment may be referred to as a unipolar switching device. By breaking this connection and connecting the emitter element of the transistor Q16 directly to the emitters of the other transistors Q15, Q17, and Q18, the device becomes bipolar, meaning that it is caused to switch between two states in response to the application sequentially of north and south magnetic poles. This feature will be explained in more detail later.

Diodes D16 and D17 are connected between the collectors and bases of transistors Q16 and Q17, as shown. Later, it will be explained that current flowing through transistor Q17 also flows through resistor 38, thereby creating thereacross a voltage drop which may be regarded as a threshold voltage that determines one switching parameter of the overall circuit. The current sink QT1 through QTC controls the level of the current ultimately flowing through resistor 38. The circuit that includes resistor 38, transistors Q1, Q2, Q15 through Q18 and QT1 through QTC may be regarded as the threshold voltage determining circuit.

OPERATION OF CIRCUITRY THUS FAR DESCRIBED

Switching operations of the circuitry thus far described will now be explained. This operation has two states termed "ON" and "OFF". The "OFF" condition occurs when no magnetic field is applied to the Hall effect cell 24. The "ON" condition occurs when a field of given magnitude is applied to the Hall cell. For the "OFF" condition, i.e., no magnetic field, transistor Q212 is biased to non-conductive state. For the "ON" condition (a magnetic field applied) transistor Q212 is biased to conductive saturation. In the immediate following, it is assumed that the Hall cell 24 is ideal, having no output voltage (offset) in the absence of a magnetic field.

Assuming that no magnetic field is applied to the Hall cell 24, equal voltages will appear at the bases of the transistors Q1 and Q2. The currents in the collectors will, therefore, be equal with the total flowing through on the current sink transistor Q12. By reason of the load resistor 34, 36, 38, 40 configuration and the connections to the collectors of the pair of transistors Q16 and Q17, there will be a slight difference in voltage at the collectors of the transistors Q1 and Q2, that on the collector of transistor Q2 being slightly lower. This lower voltage is applied to the base of the emitter follower Q6 and has the effect, when traced through to the emitter of transistor Q30, of decreasing the voltage on the emitter of the latter. The transistor Q30 is connected as an emitter follower and is never biased to an extent as will drive it to conductive-saturation or into a non-conductive state.

By the same token, the voltage on the collector of transistor Q1 (slightly higher than that on the collector of Q2) is applied to the base of emitter follower Q5 and functionally can be traced through to transistor Q29 at which the emitter voltage is increased relative to that of Q30. Since the two transistors Q29 and Q30 actually constitute the output circuits of the differential amplifier Q25 and Q26, the voltages appearing in the emitter circuits thereof, or at points 75 and 76, will correspond to the voltages appearing on the collectors of Q25 and Q26. For the signal conditions being described, the voltage at point 75 will be higher than at point 76 in an operating embodiment, this voltage at point 75 typically being 2.133 v. and at point 76 being 1.480 v.

These emitter circuit points 75 and 76 will be noted as being connected to the bases of transistors Q15, Q16, Q17 and Q18. The voltages appearing at points 75 and 76, therefore, constitute biases for the transistors Q17, Q18 and transistors Q15, Q16, respectively.

The voltage appearing on the emitters of transistors Q29 and Q30 are also coupled to the bases of the transistors Q206 and Q207, the higher voltage on the base of transistor Q207 rendering Q207 non-conductive. At the same time, transistors Q206, Q208, and Q209 are rendered conductive, with transistor Q209 being in saturation. Transistor Q210 is cut off, which results in increasing the voltage at its collector. This increased voltage as applied to the base of transistor Q211 drives the latter in to conductive saturation, thereby decreasing the voltage at the collector of transistor Q211 which is applied to the base of the transistor Q212, driving it into a state of non-conductive cut-off. Thus, it is shown that the transistor Q212 is controlled to a cut-off, non-conductive state when there is no magnetic field applied to the Hall cell 24.

For the opposite condition of operation as a unipolar device that is applying a magnetic field to the Hall cell 24, the output voltage thereof will be applied to the bases of the transistors Q1 and Q2 in the polarities shown, i.e., positive to base of transistor Q1 and negative to transistor Q2. With the more positive voltage applied to the base of transistor Q1, the collector current increases, while the transistor Q2 collector current decreases. The voltage at the collector of transistor Q1 now decreases and that on the collector of transistor Q2 increases. Thus, the base of the transistor Q5 will have a decreased voltage applied thereto and, correspondingly, the base of the transistor Q6 will experience an increased voltage. Tracing these signals through to the emitter followers Q29 and Q30, it will appear that the voltages applied to the bases thereof correspond, i.e., the voltage on the base of transistor Q29 decreases and that on the base of transistor Q30 increases.

This results in the interchange of voltages (the reason for this interchange being explained later) appearing on points 75 and 76 such that now the voltage at point 75, in the working embodiment, will be 1.480 volts and that at point 76 will be 2.133 volts. These voltages coupled through to the differential amplifier Q206, Q207 results in the transistor Q210 being driven into conductive saturation by decreasing the voltage on the collector thereof decreasing the voltage on the base of transistor Q211, causing it to cut off to a non-conductive state, increasing its collector voltage which serves to bias the base of transistor Q212 sufficiently high to drive this transistor into conductive saturation. The latter transistor being now conductive provides an indication of a magnetic field being applied to the Hall cell 24.

CURRENT-SWITCHING CIRCUIT

Matched transistors Q15, Q18 and Q16, Q17 are connected as a current-switching network. In the unipolar configuration, the transistor Q15 on the one hand and the two transistors Q17 and Q18 on the other are alternately switched between conductive and non-conductive states as the voltages on the bases thereof are suitably shifted. It will be recalled that the voltages appearing at the points 75 and 76 of the emitter followers Q29 and Q30 are derived from the output circuits of differential amplifier composed of the two transistors Q25 and Q26.

With the condition of no magnetic field applied to the Hall cell 24, the voltage at point 75 will be higher than that at point 76. This voltage at point 75 applied to the bases of transistors Q17 and Q18 biases the latter into a fully conductive state, with the lower voltage on point 76 as applied to the base of transistor Q15 being sufficiently low as to render this transistor non-conductive. Since only transistors Q17 and Q18 are conductive, all current in the constant current circuit QT1–QTC passes through resistors Q17 and Q18. It should be noted that the current carrying capacity of these transistors Q17 and Q18 is designed to be the same as that of transistors Q15 and Q16. More specifically, the transistor Q18 conducts three-fourths of the total current carried by the two transistors Q17 and Q18 jointly, transistor Q18 being physically larger. Transistor Q15 carries all of the current conducted by the two transistors Q15 and Q16, since the base of transistor Q16 is shorted to the emitter, forcing it to the "OFF" state.

The collector of transistor Q17 is connected to resistor 38. A voltage drop is produced across resistor 38 which is reflected as dropping the voltage at the juncture between the two resistors 38 and 40. Typical values in the working embodiment would be 3.355 volts, representing "no field" applied to the Hall cell 24, and 3.380 volts for the condition of an applied magnetic field. Because of this difference in the two voltage drops, the same voltages at the collector of transistor Q2 for the same conditions of "no field" and "applied field" will correspondingly change. This change in voltage at the collector of transistor Q2 as compared with the voltage present on the collector of transistor Q1 results in shifting the output signals correspondingly at the collectors of the differential amplifier Q25, Q26, which in turn are reflected at the emitters of the two emitter follower transistors Q29 and Q30.

It will now be appreciated that the current switching network, Q15, Q16, Q17, and Q18, constitutes a feedback circuit. The signal fedback to the collector circuits of the transistors Q1 and Q2 from the points 75 and 76 is in a positive direction such that the voltage at the collector of transistor Q2 almost instantaneously shifts from a given value for a "no field" condition to a higher value upon field application. This substantially instanteous switching action will be further explained.

Before doing so, however, the reason for the difference in voltages between the two points 75 and 76, i.e., the difference between 2.133 volts and 1.480 volts, will be explained. The joint gain of the second amplifier 20 composed of the two differential amplifiers Q19, Q20 and Q25, Q26 is designed to be quite high as compared to the gain of the preamplifier Q1, Q2. In working embodiment, the gain of each of the two amplifiers Q19, Q20 and Q25, Q26 is thirty-five (35), making the total gain of the two amplifiers thirty-five times thirty-five (35×35), or, in other words, one thousand two hundred twenty-five (1225). Because of the back-to-back diodes Q21, Q22, Q27, Q28, the voltage difference between the collectors of the amplifier Q19, Q20 and Q25, Q26 cannot exceed the normal drop across a diode which is about 0.7 volts. This occurs because if the voltage between the collectors exceeds this drop, one or the other of the diodes will conduct. Thus, for example, for a one millivolt voltage difference appearing at the bases of the two transistors Q19 and Q20, without the back-to-back diodes in the circuit, the voltage difference appearing between the collectors of the transistors Q25 and Q26 will be one thousand and two hundred twenty-five times one millivolt (1225×0.001 v.) which would be about 1.225 volts. However, because of the presence of the back-to-back diodes, Q21, Q22 and Q27, Q28, this output voltage is limited or clamped down to a value of approximately 0.7 volts, or, in other words, the normal drop across the diode. It will now appear that the voltage output from the amplifier Q25, Q26 which appears at the points 75 and 76 can never exceed about 0.7 volts, and, more precisely in a working embodiment, the difference between the two values of 2.133 volts and 1.480 volts. This voltage difference applied to the bases of the transistors Q15, Q17 and Q18 determines which of these are conductive and non-conductive, respectively.

The amplifiers Q19, Q20 and Q25, Q26, which may be considered to constitute a voltage comparator, are designed to have excessively high gain so that any change in gain due to changing temperatures, processing parameters, and the like will be ineffectual in determining the ultimate switching point of the circuitry.

The high gain amplifiers Q19, Q20 and Q25, Q26 are rendered relatively insensitive to ambient temperature changes by reason of the voltage divider network of resistors 70 and 72 series-connected between the positive and negative supply voltage busses 26 and 28. These resistors interconnected with the transistors Q31 and Q32 provide a network for biasing the current sinks Q34 through Q39 and Q200.

Assuming the higher voltage as between point 75 and point 76 appears at point 75, the transistors Q15, Q17 and Q18 are biased such that only Q17 and Q18 are conductive, Q15 being non-conductive. The current flowing in the two collector circuits of the two transistors Q17 and Q18 must be the same as that flowing through the current sink QT1–QTC, which, at ambient temperature conditions of twenty-five (25) degrees centigrade, provides a current through the resistor 38 which produces thereacross a voltage drop of approximately twenty-five (25) millivolts. This twenty-five (25) millivolts across resistor 38 may be considered to be the threshold voltage that must be overcome or neutralized at the collector of transistor Q2 before transducer switching will occur or, in other words, before transistor Q15 will become conductive and transistors Q17 and Q18 non-conductive.

It will now be noted that for conditions of "no field" applied to the Hall cell 24, the voltages on the bases of the transistors Q1 and Q2 will be equal, thereby causing equal currents in the collectors. However, because of the twenty-five (25) millivolt drop across resistor 38, the voltage at the collector of transistor Q2 will always be twenty-five (25) millivolts below that on the collector of transistor Q1 (again remembering this is for "no field" conditions). This voltage at the transistor Q2 collector is amplified, providing that the higher voltage between point 75 and point 76 is at point 75. This higher voltage maintains the transistors Q17 and Q18 conductive and the transistor Q25 non-conductive. In the circuit design, this voltage on the base of transistor Q17 does not drive it into conductive saturation but at a point slightly therebelow.

Now assuming that a transducer-switching action is desired, a magnetic field is gradually applied to the Hall cell 24 until the flux density rises to a switching value of, for example, one hundred (100) gauss. This gradual application can be simply effected by moving a pole of an ordinary bar magnet slowly toward the Hall cell 24 until the desired field strength is applied. As the field progressively increases on the Hall cell 24, its output voltage correspondingly increases.

Figure 13:
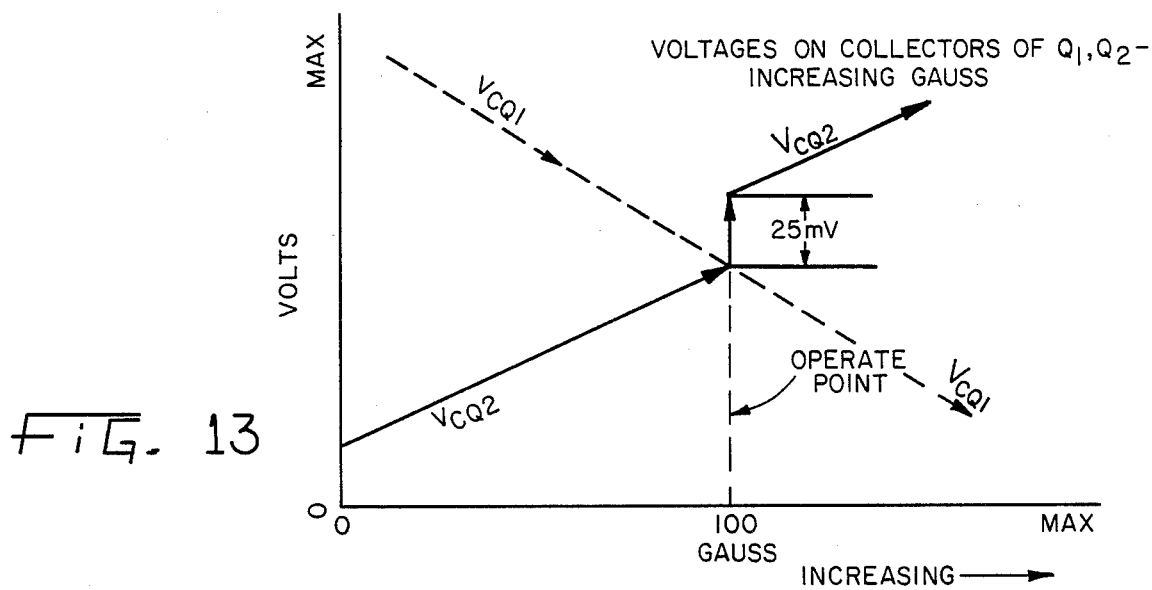
FIGS. 13 and 14 are graphs showing collector voltages of the first amplifier as they change for both "operate" and "release" conditions of the transducer.
Figure 14:
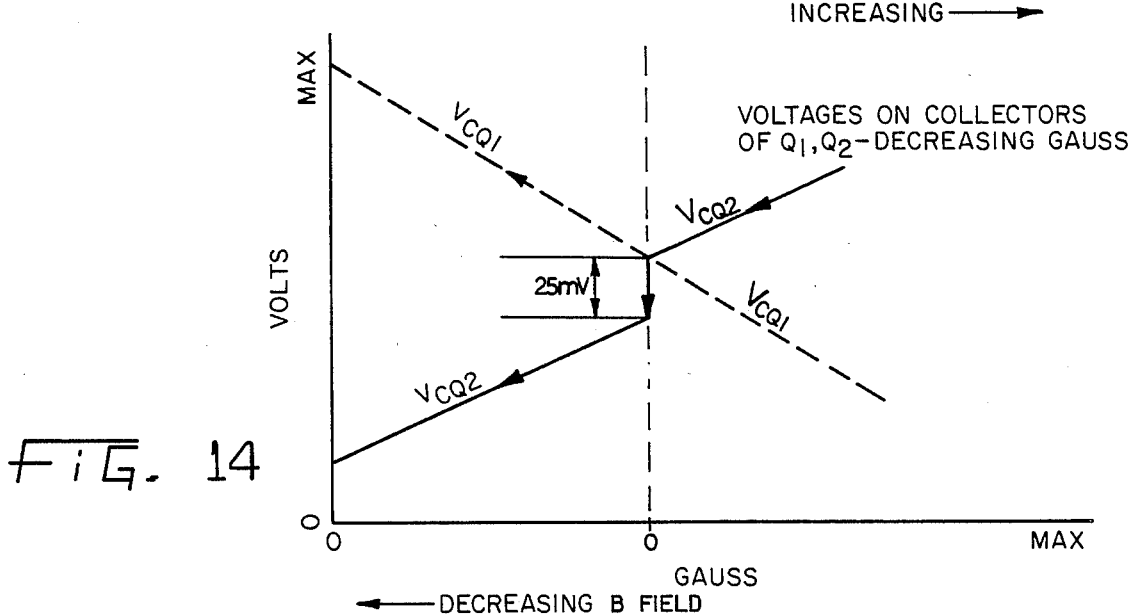

This results in progressively higher positive voltage being applied to the base of transistor Q1, which increases the transistor Q1 collector current and correspondingly decreases the transistor Q2 collector current. Decreasing the transistor Q2 collector current causes the voltage at the transistor Q2 collector to start increasing (FIG. 13) and that at the transistor Q1 collector to start decreasing. This reduced voltage difference between the two collectors of transistors Q1 and Q2 is applied to the differential amplifiers Q19, Q20 and Q25, Q26, and appears in amplified, but limited form, at the points 75 and 76. When the voltage difference appearing between the two collectors of transistors Q1 and Q2 reaches a sufficiently low level that the amplified voltage appearing at the collectors of the two transistors Q25 and Q26 starts dropping below 0.7 volts, the voltage at point 75 starts decreasing from a maximum value of about 0.7 volts and that at point 76 starts increasing.

As the application of the field on the Hall cell 24 further increases, eventually the voltage appearing at the base of transistor Q17 will reduce to about two-tenths (0.2) volts higher than that on the base of transistor Q15. When this occurs, the transistor Q17 collector current starts reducing, which causes a reduction in the voltage drop across the resistor 38. This reduced voltage drop causes a further increase of the voltage on the collector of transistor Q2, which is further amplified by the amplifiers Q19, Q20 and Q25, Q26 and applied to the points 75 and 76 as a further reduction in the voltage difference at points 75 and 76. In other words, the voltage at point 75 further reduces. It will now be seen that this action constitutes positive feedback and will continue until the voltage at point 75 lowers sufficiently to render transistor Q17 non-conductive. Simultaneously, the voltage at point 76 increases sufficiently to render transistor Q15 fully conductive. This shift in conductivity is very rapid and in a working embodiment of this invention is designed to occur when the strength of the magnetic field applied to the Hall cell reaches about one hundred (100) gauss. This is considered to be the "operate point" of the transducer.

With the transistor Q17 non-conductive, the voltage drop across the resistor 38 due to transistor Q17 is now removed and, because of the imbalance in the transistor Q1 and Q2 collector currents due to the positive voltage on the base of transistor Q1, the voltage at the transistor Q1 collector is now lower than that at the transistor Q2 collector by a value of twenty-five (25) millivolts. This is in turn amplified by the amplifiers Q19, Q20 and Q25, Q26, and is applied across points 75 and 76 accordingly, driving transistor Q17 into a more non-conductive state which serves to, in effect, latch the transducer circuit into the "operate" condition.

It should now be noted that, since it is necessary for the voltage drop across the resistor 38 (assumed to be twenty-five (25) millivolts) to be overcome (removed) in order to obtain the switching action, the amplifier Q1 and Q2 must have sufficient gain to equal and overcome the twenty-five (25) millivolts for a given output voltage from the Hall cell 24 when subjected to a field strength of one hundred (100) gauss. As will be later explained, the gain of the amplifier Q1, Q2 is controlled by the current sink Q12, which is itself controlled according to ambient temperature conditions by the resistive voltage divider circuit 44 and 46 in conjunction with the transistor components Q9 and Q10. This will be explained in more detail later.

Now, the opposite switching condition will be explained. Assuming that the magnetic field is progressively gradually removed from the Hall cell, the output voltage from the Hall cell 24 will correspondingly reduce and will be applied to the bases of the amplifier Q1 and Q2. The voltage on the base of transistor Q1 diminishes, thereby causing its collector current to correspondingly decrease. The transistor Q1 collector voltage now starts increasing. The transistor Q2 collector current simultaneously starts increasing, thereby causing the voltage at the transistor Q2 collector to start decreasing. It should be remembered that the transistor Q17 is non-conductive so, as a consequence, there is no voltage drop across the resistor 38 due to the current sink network QT1 through QTC, all of this current being bypassed through transistor Q15 to the positive buss line 26.

As the differential voltage between the two collectors of transistors Q1 and Q2 starts reducing, the amplified version thereof appears at points 75 and 76 to be applied to the bases of the transistors Q15, Q17, and Q18. When the voltage conditions are such that the voltage at point 75 increases to a sufficient level, the transistors Q17 and Q18 will start conducting and drawing current through the resistor 38. Simultaneously, the transistor Q15 starts to lose conductivity. The voltage drop across resistor 38 now produces a further drop in voltage at the collector of transistor Q2, starting the positive feedback which is in a direction to apply a higher voltage to the base of transistor Q17, rendering it more conductive, and hence increasing the flow of current through the resistor 38. As the magnetic field is further withdrawn from the Hall cell 24, a current distribution between the two transistors Q1 and Q2 will continue to shift until the difference in voltages applied to the bases of the transistors Q15 on the one hand and Q17, Q18 on the other reaches about two-tenths (0.2) volts, and almost instantaneously transistor Q15 becomes non-conductive and Q17, Q18 conductive. This reestablishes a twenty-five (25) millivolt drop across the resistor 38 and the condition of the voltage on the collector of transistor Q2 being twenty-five (25) millivolts lower than that on the collector of transistor Q1. This condition is the "release point" of the transducer circuit, meaning that its switching condition has abruptly shifted from one state to the opposite state. It will now be appreciated that the difference in field strengths as between "operate" and "release" provides for a hysteresis characteristic.

While the value of about two-tenths (0.2) volts has been used in explaining the beginning of the rapid switching function of the steering circuit Q15, Q16, Q17, Q18, more precisely it can be shown that when the difference in voltage between the bases of Q15, Q16, and Q17, Q18 is about 0.160 volts, the switching action will abruptly occur. In a working embodiment of this invention, it has been found that this switching action occurs in about fifty (50) nanoseconds. This switching action is otherwise explained by the graph of FIG. 9 wherein the abscissa may be regarded as representing time, and the ordinate as voltage between points 75 and 76, the time span between the two values of the reversed polarity of 0.160 millivolts being about 50 nanoseconds.

As explained earlier, as between the two transistors Q17 and Q18, transistor Q18 conducts three-fourths (¾) of the total current. The reason for this disparity in conductivity is that if the transistor Q17 conducted too heavily, the resistor 38 would have to be made much smaller in order to obtain the desired voltage drop of twenty-five (25) millivolts. In integrated circuit work, this becomes impractical. Therefore, the current through the transistor Q17 is limited by shunting some of the current through transistor Q18. In a working embodiment of the present invention, the value of resistor 38 can be 61.5 ohms, which is not too difficult to produce in an integrated circuit.

Figure 4:
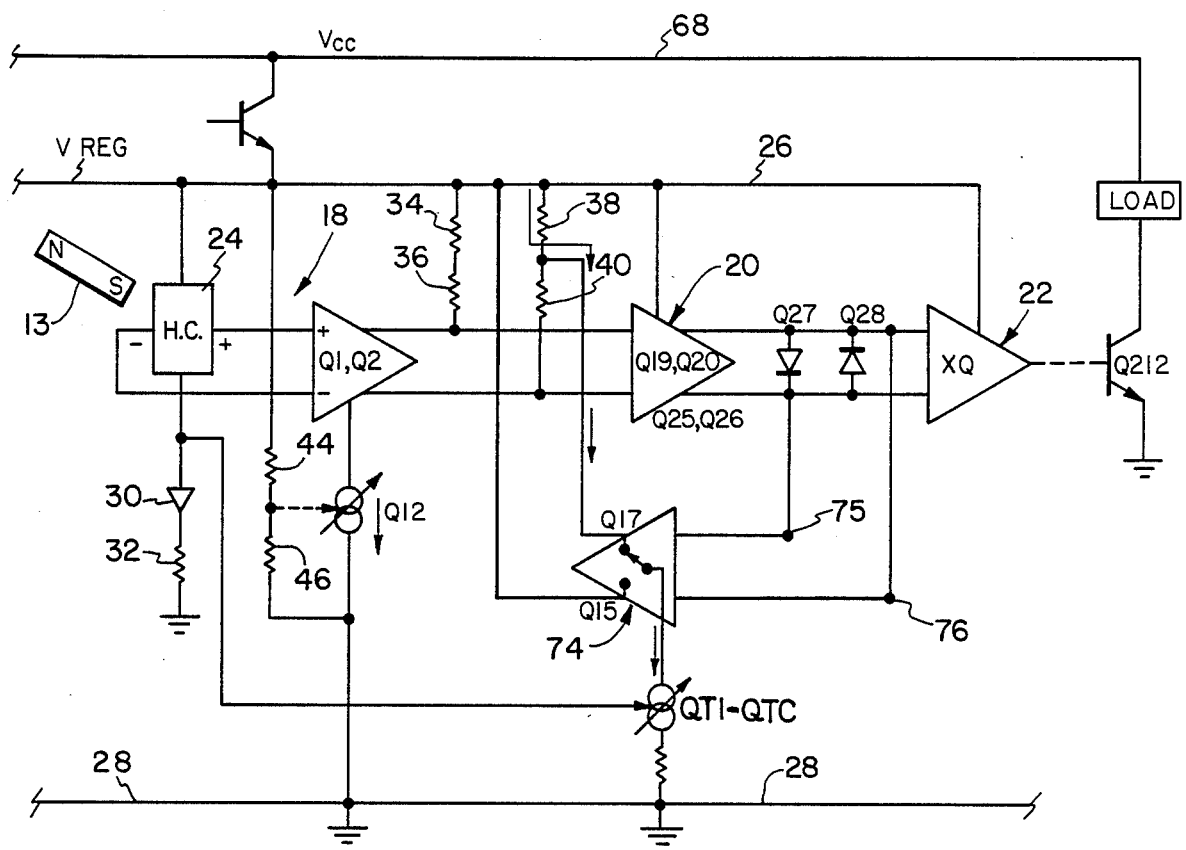
FIG. 4 is a simplified block diagram of the remainder of the integrated circuit.
Figure 15:
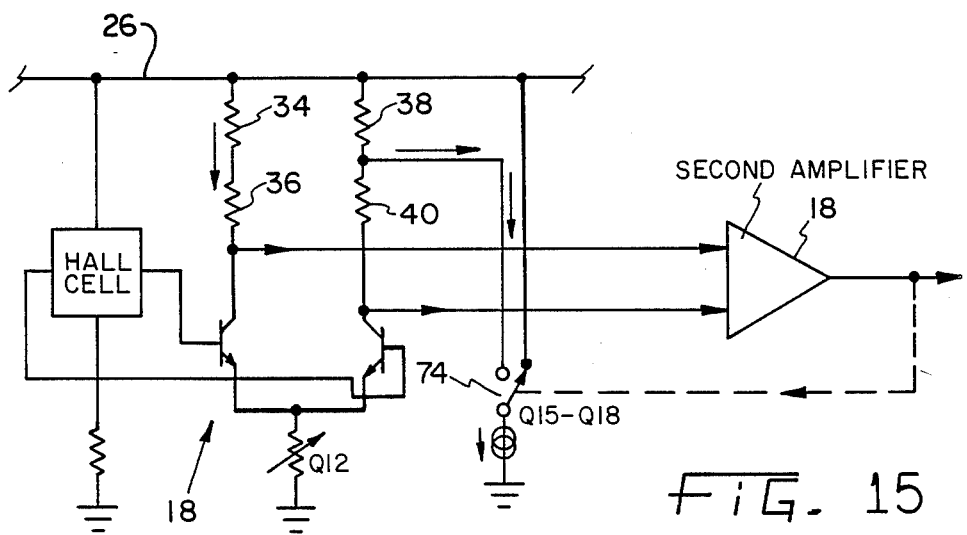
FIG. 15 is a simplified, equivalent schematic diagram used in explaining threshold voltage generation.

In summary, the network of transistors Q15, Q16, Q17, and Q18 may be considered to be a switch, as illustrated in FIG. 4, further simplified in FIG. 15, and identified by the reference numeral 74. For the condition of a "no field" applied to the Hall cell 24, the switch 74 will be in the position shown, drawing current through the resistor 38 thereby to set up the twenty-five (25) millivolt threshold voltage condition. With a maximum strength field, for example, one hundred (100) gauss, applied to the Hall cell 24, the switch would be shifted to the Q15 position, which shows that no steering current will be passed through the resistor 38, but instead the current will be bypassed to the positive voltage buss 26.

A unique feature resides in breaking the connection, base to emitter, of the transistor Q16 and connecting the emitter directly to the emitters of Q15, Q17, and Q18. In doing so, the transducer is converted from unipolar to bipolar operation, since resistor 34 becomes the threshold resistor for transistor Q16, as was the resistor 38 for the transistor Q17. For unipolar operation, only a single pole of the actuating magnet, e.g., south pole, is moved toward and away from the Hall cell 24 in order to produce switching. Under bipolar operation, one pole proximal to the Hall cell 24 actuates the transducer to one state, while the movement of the magnet to bring the opposite pole proximal thereto changes the transducer to the opposite state.

Figure 9:
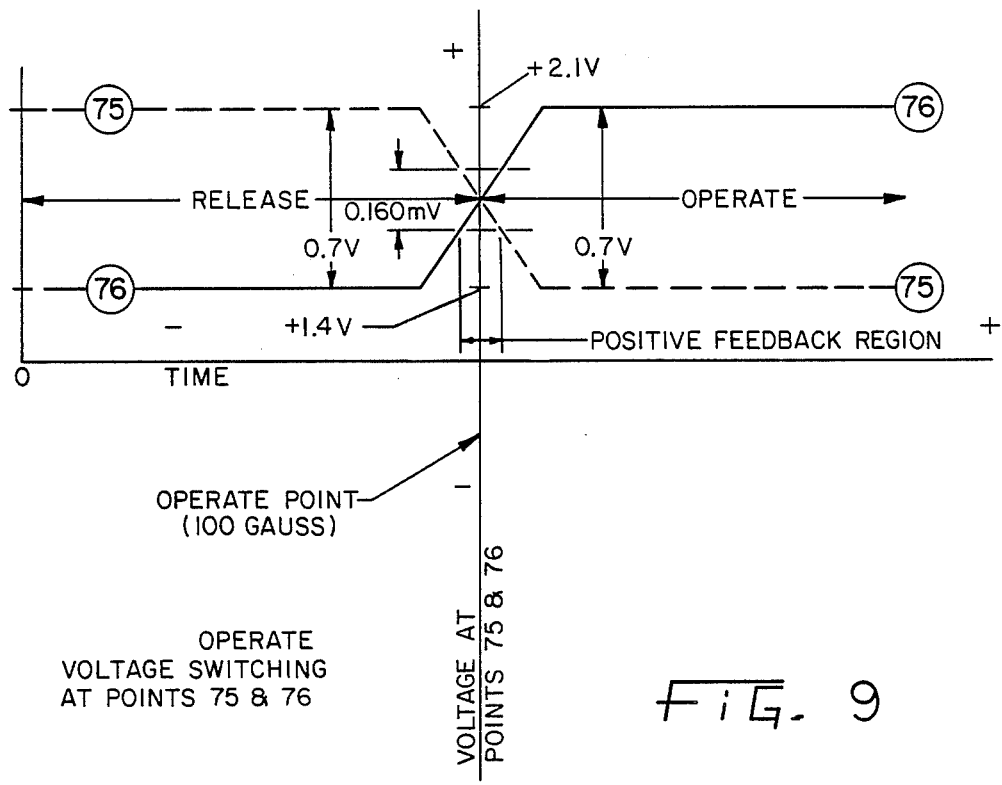
FIG. 9 is a graph used in explaining the operation of the threshold switching action of the second amplifier.

The differential voltage relationship existing at the points 75 and 76 and the switch-over action by the steering circuit Q15 through Q18 are graphically illustrated in FIG. 9, wherein it is shown that during the period of "release," the voltage spread between the two points 75 and 76 is approximately seven-tenths (0.7) volts. As the input voltage to amplifier 20 decreases to a critical point, then the voltages on points 75 and 76 start changing in a direction to decrease the spread therebetween, the voltage on the point 75 being indicated by the dashed line and that on point 76 by the solid line. As this spread diminishes to a value of about 0.160 millivolts, states of conductivity of Q15 and Q17 rapidly interchange, with the voltage on point 76 going high and that on point 75 going low, the maximum spread therebetween remaining at seven-tenths (0.7) volts again as clamped by the diodes Q27 and Q28. As indicated, when the voltage drops below 0.160 volts, positive feedback initiates and the rapid switching occurs, this switching or crossover function requiring about fifty (50) nanoseconds.

The transducer is intended to switch in every instance at zero and maximum applied fields. Zero switching is assured because with no field on the Hall cell, the cell output voltage is essentially zero, or sufficiently close to zero that the currentswitching circuit Q15–Q18 is switched to its corresponding "zero" position, i.e., Q17 is fully conductive of threshold voltage-determining current through resistor 38. For maximum applied gauss, the opposite condition exists: Q17 has become non-conductive, and no threshold voltage-determining current is flowing through resistor 38. The balanced differential configurations of all of the relevant circuits (Q1, Q2, Q19, Q20, Q25, Q26, Q15, Q16, Q17, Q18), by reason of common mode rejection, assure that for zero gauss, the transducer is "OFF" and for maximum gauss, the transducer is "ON".

The position of the threshold voltage resistors 34 and 38 is unique. With reference to the amplifier Q1, Q2, the resistors 36 and 40 in the collector circuits determine the gain "Av" of the amplifier Q1, Q2. Because the disparity in values is so great as between resistors 34 and 38 on the one hand and 36 and 40 on the other, the threshold voltage resistors 34 and 38 have little or no effect on the gain "Av", and the amplifier collector currents are so small by comparison to the current through the circuit sink network QT1–QTC that operation of amplifier Q1, Q2 has little or no effect in determining the voltage drops (threshold voltages) across the respective threshold voltage resistors 34 and 38.

Placement of resistors 34 and 38 between the load resistors 36 and 40, respectively, and the positive voltage buss 26, isolates the temperature coefficients of other circuits and components from the threshold voltage-determining circuit.

The resistors 34 and 38 are connected to a low impedance of less than one (1) ohm, which is the impedance presented by the regulated voltage supply 16. The output impedance of the amplifier Q1, Q2 is effectively isolated from the voltage drop across resistors 34 and 38.

OUTPUT DRIVER SWITCHING

Figure 6:
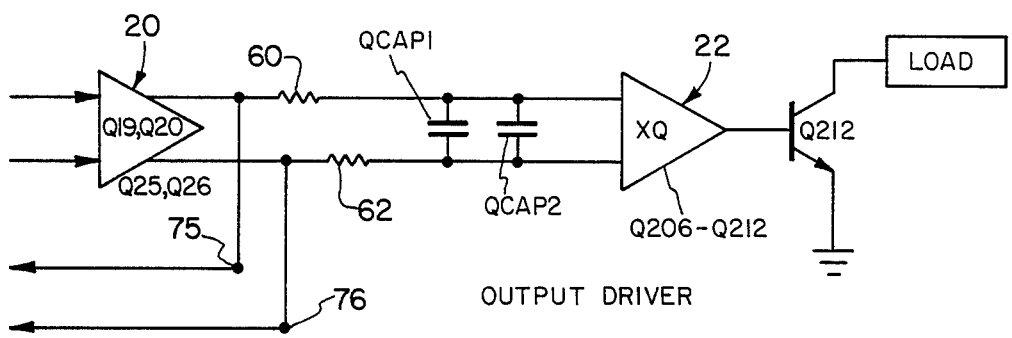
FIG. 6 is a block diagram of the delay circuitry between the second amplifier and the output driver.

These rapidly changing voltages, at points 75 and 76, are coupled to the differential amplifier Q206, Q207 via two resistors 60 and 62. Unless there were something to overcome the fast switching cycle of fifty (50) nanoseconds, this amplifier Q206, Q207 would switch just as rapidly, causing output transistor Q212 to change states therewith. This rapid change in conductivity can induce unwanted oscillation and cause other undesired effects. As shown in the block diagram in FIG. 6, the input circuit to the amplifier XQ (which includes all of the transistors Q206 through Q212) has a resistor-capacitor time constant network which includes not only the two resistors 60 and 62, but also two capacitors QCAP1 and QCAP2. These capacitors are in reality NPN transistors, connected as shown in FIG. 6, biased to have conductivity characteristics resembling capacitors rather than transistors. This is a common technique in integrated circuit technology.

Figure 10:
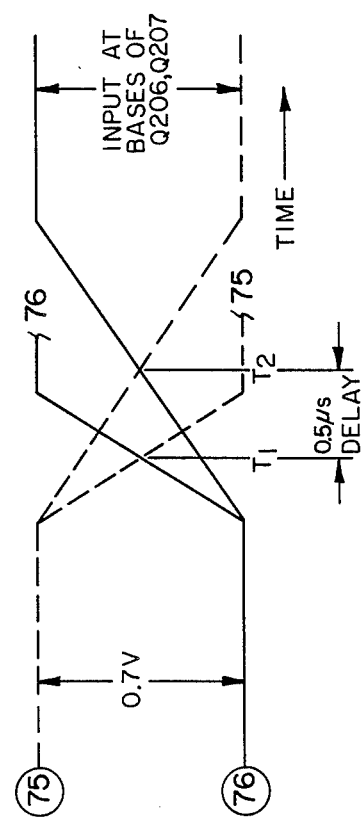
FIG. 10 is a graph used in explaining the delay feature of the circuit of FIG. 6.

In effect, the rapid transition switching of fifty (50) nanoseconds is delayed by this time constant circuit by about one-half microsecond, which is enough to prevent ringing or oscillation and also to reduce the switching time of the amplifier circuitry XQ, which includes the output transistor Q212. The delay in switching time is graphically shown in FIG. 10 (in part, a duplication of FIG. 9) wherein the time T1 corresponds to the zero crossover point in FIG. 3, and the spread between times T1 and T2 illustrates the delay time of one-half microsecond. It will also be noted that the voltage change between times T1 and T2, and also to the full rise of the voltages at points 75 and 76, are somewhat gradual, this serving to reduce the severity of switching and the tendency to produce oscillation.

It also provides time within which the amplifier Q1 and Q2, as well as the steering circuit Q15 through Q18, can settle down and provide the new voltage drop of twenty-five (25) millivolts across the resistor 38 (assuming room temperature). As shown in FIG. 2, the collector of the transistor Q212 is not connected to the regulated positive voltage buss 26. Instead, it is adapted to be connected to the unregulated supply side 68 thereby to reduce the load impact and switching transients on the regulated part of the power supply.

The entire signal path, beginning at the output terminals of the Hall cell 24, includes the amplifier Q1, Q2, the amplifiers Q19, Q20 and Q25, Q26, and the current-steering network Q15–Q18 are balanced differential amplifier circuits. As such, they each have two imput circuits. Should a noise signal appear at the two input circuits, it would not be translated to the respective output circuits in the form of signals. Instead, it will be nullified by reason of the common mode rejection characteristic in the operation of differential amplifiers.

The capacitance of sensitive nodes in the integrated circuit is balanced. Transistor Q16 is present to serve as a capacitor in the unipolar configuration. When the base and emitter are shorted, as shown in FIG. 1, the capacitance of transistor Q17 is balanced. Also, the delay network, composed of resistors 60 and 62 and the transistor-capacitor QCAP1 and QCAP2, serves to filter high frequency noise spikes from reaching and switching the output driver transistor Q212. These noise-immunizing features facilitate incorporating this transducer chip into various circuit environments, requiring less capacitive bypassing, for example, than otherwise would be necessary in the absence thereof.

AMPLIFIER Q1, Q2 GAIN CHANGE WITH TEMPERATURE

Figure 11:
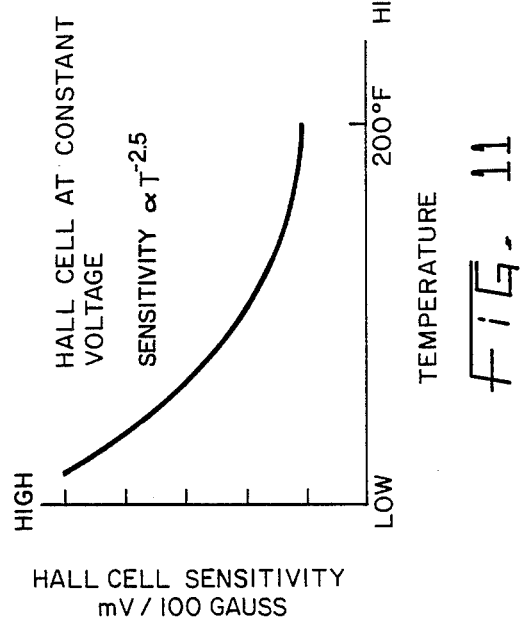
FIG. 11 is a graph showing the characteristic performance of a typical Hall element with temperature change.

As explained hereinbefore, it is important that the transducer change state when the magnet pole is a given distance from the Hall cell 24, even though there are changes in ambient temperature. As ambient temperature increases, current through the Hall cell 24 decreases, as illustrated graphically in FIG. 11. For this condition, the voltage over the Hall cell 24 is maintained substantially constant. This reduction in current through Hall cell 24 is mirrored at the current controlling circuit QT1-QTC, thereby reducing the current through the current-steering network Q15 and Q18, and correspondingly through the diffused base resistor 38. The voltage drop across resistor 38 now decreases, thereby establishing a lowered threshold voltage. However, because of the temperature increase, the resistance of resistor 38 increases, thereby causing a corresponding increase in the voltage drop there, remembering that because of the current sink QT1 through QTC, the value of current remains constant. Thus, while the temperature increase has caused a reduction in the voltage drop due to the reduced current flow through the current sink QT1 through QTC, the resistance increase of the resistor 38 has caused an increase of the voltage drop. This voltage increase is counter-productive and must be overcome.

Bearing in mind that the Hall cell 24 output voltage has decreased with the increase in temperature, the input voltage to the amplifier Q1, Q2 thus decreases. The corresponding output voltage of the amplifier Q1, Q2 also decreases and may be inadequate to overcome the increase in voltage drop due to the increased resistance of resistor 38.

This inadequacy is overcome by causing an increase in the voltage gain of the amplifier Q1, Q2, and this is provided by increasing the current flow through the constant current sink Q12. This current flow increase is responsive to the same incremental temperature increase by reason of the resistor divider network made up of the series resistors 44 and 46 and the interconnected biasing transistors Q9 and Q10. The values of the resistors 44 and 46 and the interconnected components are so selected that by reason of the temperature increase and the resulting variation in the voltage drops across resistors 44 and 46, a higher positive voltage is applied to the base of transistor Q12, thereby providing the aforesaid increase in current flow and consequent voltage gain in the amplifier Q1, Q2. Thus, it may be summarized that the gain of amplifier Q1, Q2 has a positive temperature coefficient providing an increased voltage gain with temperature increase.

However, a second effect is to be reckoned with in the gain adjustment of the amplifier Q1, Q2. That relates to the reduced magnitude of magnetic field of the actuating magnet with the same incremental ambient temperature increase; at room temperature the field may be assumed to be one hundred (100) gauss and for the temperature increase to drop to ninety (90) gauss.

Since reduced magnet output is reflected in reduced output voltage of the Hall cell 24, even more gain in the amplifier Q1, Q2 is required. This supplemental gain is accounted for by the temperaturesensitive biasing circuit composed of the resistors 44 and 46, which will now be seen as instrumental in providing additional gain compensation in the amplifier Q1, Q2 because of the dual, counteracting effects of the positive temperature coefficient of resistor 38 and the negative temperature coefficient of the actuating magnet. Thus, even though the reduced Hall cell current, with temperature increase, is mirrored in the QT1 through QTC circuit to reduce the voltage drop developed over the resistor 38 for the purpose of accommodating the lowered output voltage of the Hall cell 24, this current reduction alone is inadequate to establish threshold conditions required for switching. In other words, if only the mirrored current were relied upon to set up a new threshold voltage, proper switching could not be achieved. Thus, as a part of the circuit function in adjusting automatically the threshold voltage and then in meeting this adjusted value to achieve desired switching, gain adjustment of the amplifier Q1, Q2 becomes an inextricable part. The gain increase compensates for the weaker magnet plus the positive temperature coefficient of the resistor 38. The end objective is to provide such gain that the temperature coefficient of the transducer 10 substantially tracks that of the magnet 13 at the "operate" point.

DESIGNING TRANSDUCER TEMPERATURE COEFFICIENT AT OPERATE POINT

Figure 5:
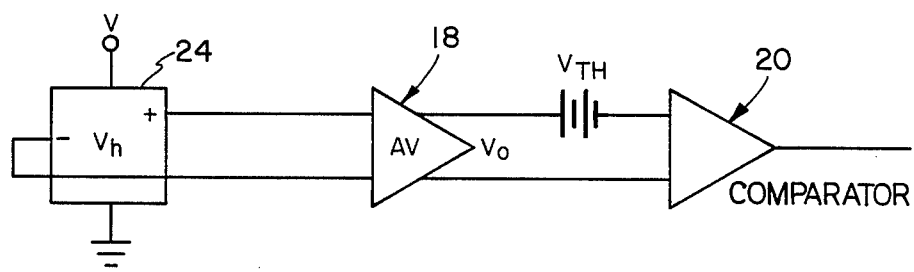
FIG. 5 is a simplified block diagram of a portion of the circuitry, and is used in explaining the methodology of relating amplifier gain and temperature coefficient.
Figure 2A:
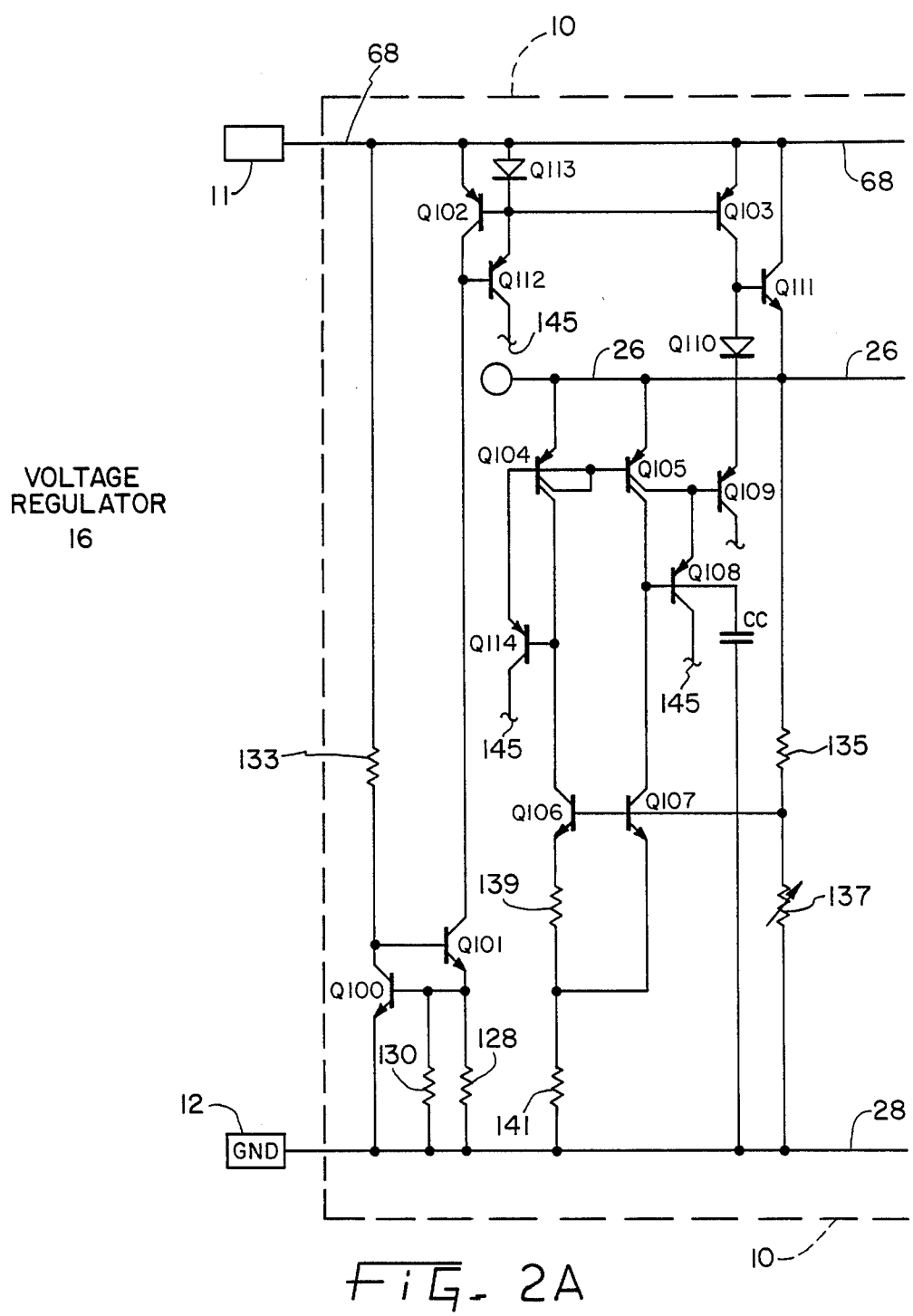
FIGS. 2A, 2B, 2C, and 2D are circuit diagrams of the integrated circuit.
Figure 2B:
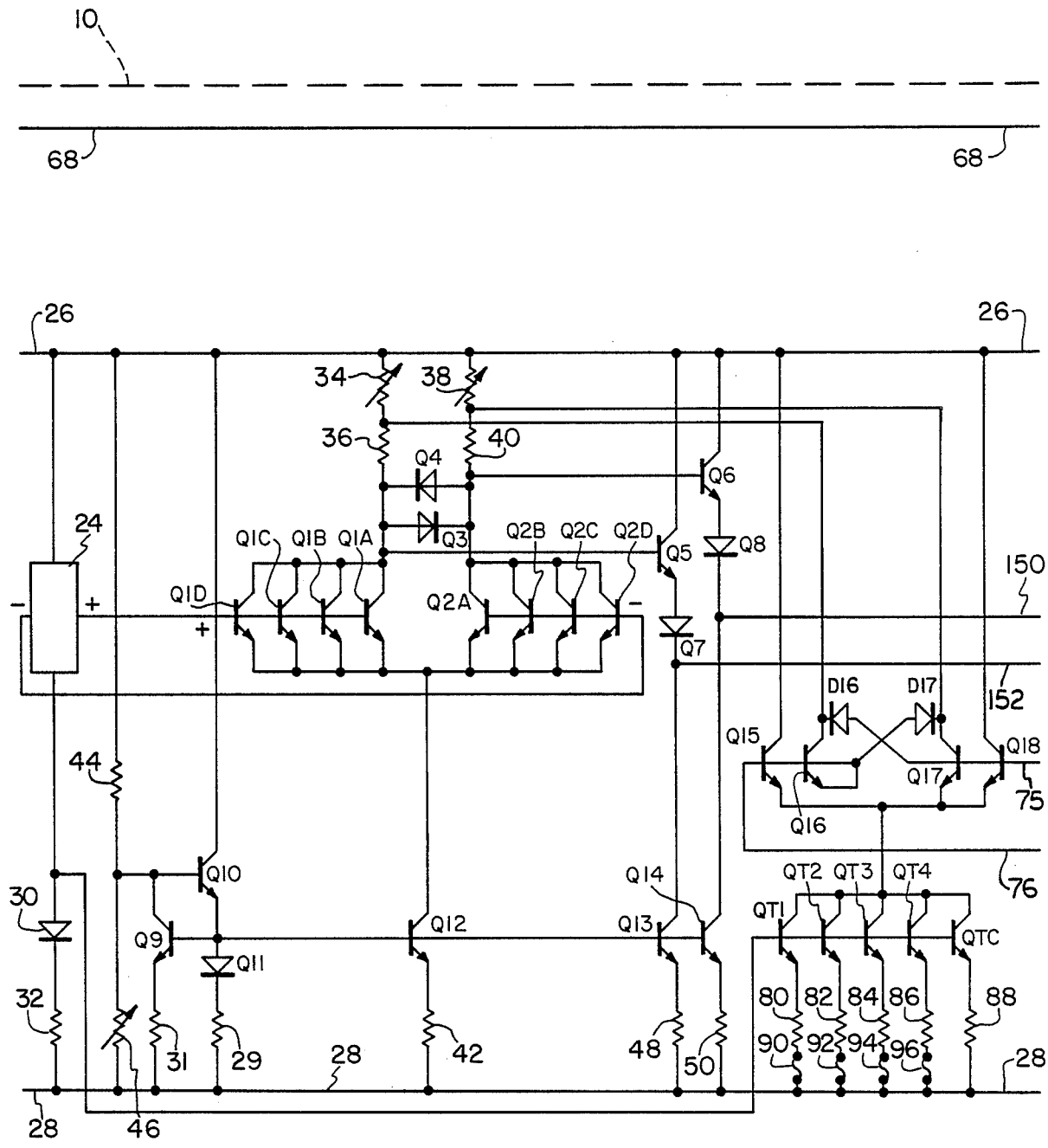
Figure 2C:
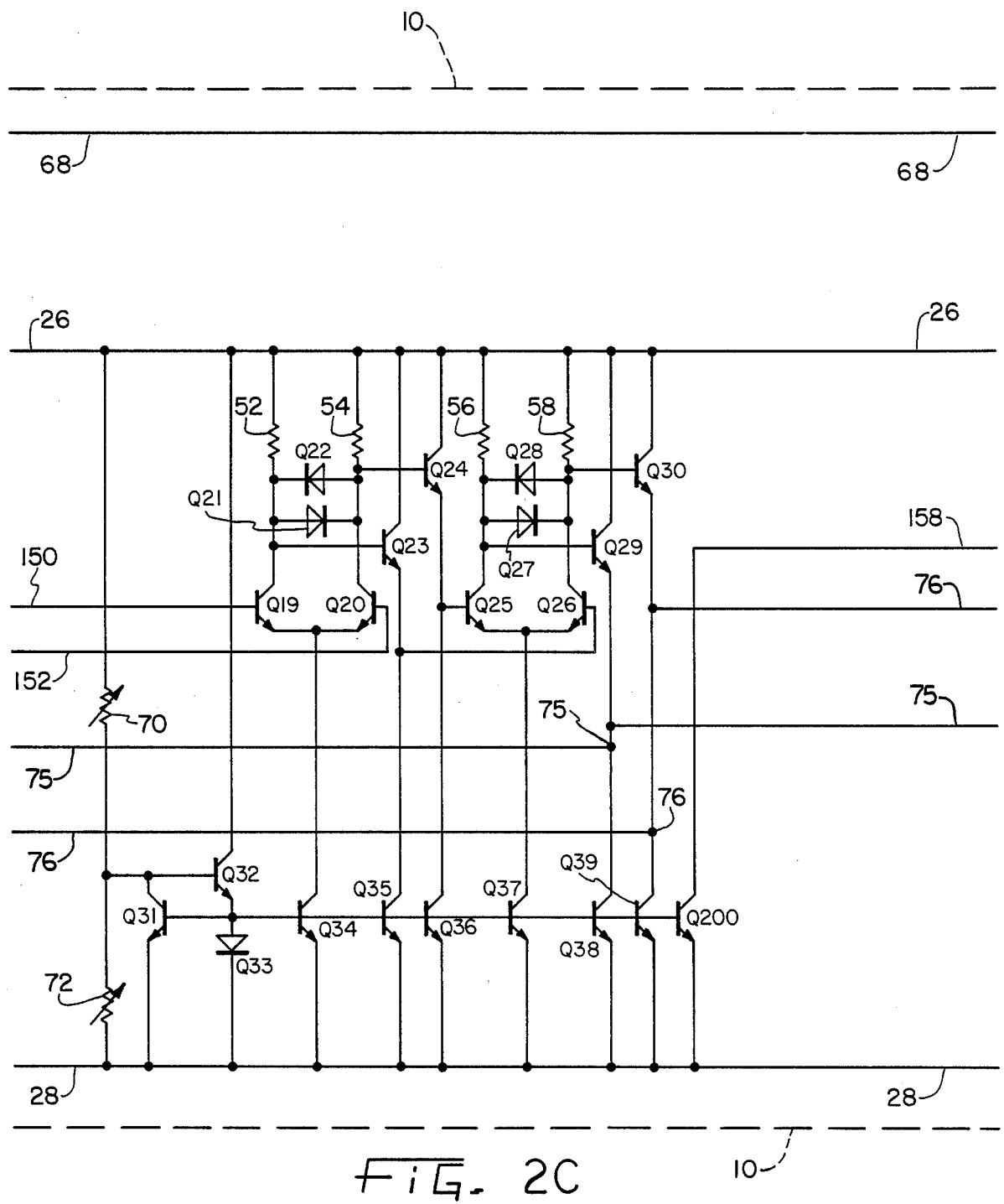
Figure 2D:
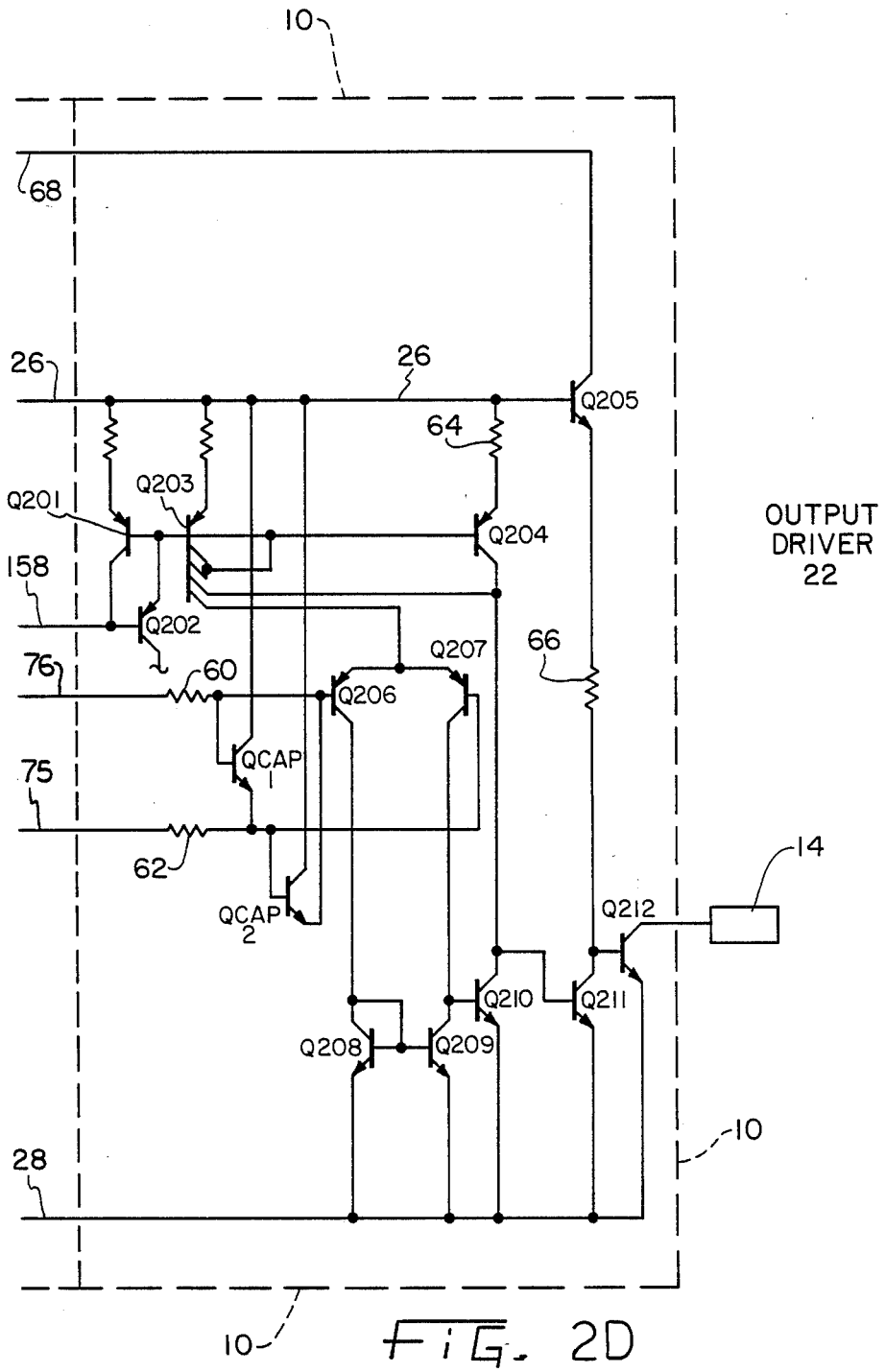

Referring to FIG. 5:

$$V_h = \frac{\mu n V_s B}{G} \qquad \text{Equation A.}$$

$V_h$ = Hall Cell output voltage.
G = Geometric factor; depends upon the shape of the Hall element.
$\mu n$ = Electron mobility.
$V_s$ = Voltage applied to the Hall element bias terminals.
B = Applied magnetic field normal to plane of Hall element.

Note that the Hall cell output voltage is not dependent on the epitaxial doping level "n". Bias voltage "$V_s$" is the regulated voltage on buss 26 minus the drop across diode 30 and resistor 32, and is tightly controlled, depending upon resistor ratios 135/137 and 139/141. "$V_h$" at "B"=93 gauss is repeatable at 25° C. (ignoring offset in the Hall element and amplifier). The output voltage "$V_h$" obtained in the integrated circuit of this invention for 93 gauss is about 1.39 millivolts.

The amplifier output $$V_o = A_v V_h.$$

"Av" is the gain of the amplifier and in the integrated circuit of the invention is 18.

Substituting equation A.

$$V_h = \frac{\mu n V_s B}{G}$$

$$V_o = \frac{1}{G} Av\, \mu n V_s B = \text{about 25 mv. at 25}° \text{ C.} \quad \text{Equation B.}$$

The threshold voltage is $$VTH = \frac{L}{16} I_h R_{HYST}, \quad \text{Equation C.}$$

where "L" is the trim adjustment number which in this invention is equal to or greater than four but is equal to or less than 19. "L" depends on which of the fusing links 90–96 have been blown or opened, and a current-carrying value for diode 30 of 16 times that of transistor QT1.

"$I_h$"=current through the Hall element
$R_{HYST}$=Resistor 38.

$$I_h = \frac{V_s}{R_h} \quad \text{Equation D.}$$

$$\text{"}R_h\text{"} = \begin{array}{c}\text{resistance}\\ \text{of Hall}\\ \text{element}\end{array} = \frac{G}{q\mu_n nt}; \quad \text{Equation E.}$$

substituting equation E into equation D, $$I_h = \frac{q\mu_n nt V_s}{G},$$

where
"q"=electronic charge,
and
"t"=effective Hall element epitaxial thickness.
substituting in equation C, $$VTH = \frac{L}{16} \frac{q\mu_n nt V_s}{G} R_{HYST}.$$

At switch point,
Vo=VTH; therefore $$\text{"B" at operate point} = \frac{L}{16} \frac{qtnR_{HYST}}{Av}. \quad \text{Equation F.}$$

"Av" (amplifier gain factor) depends upon a resistor ratio as already explained, and is repeatable.

"L" is the result of a composite adjustment for process variations in "t", "n", and "RHYST." This adjustment is performed in practice by opening fusible links 90–96 to obtain approximately 25 millivolts drop across resistor 38, as previously explained.

Equation F is invariant with temperature if "RHYST" and "Av" are constant. "RHYST" is boron diffused resistor 38 and has a temperature coefficient of about +0.11%/°C., so "B" at the operate point can be held constant by designing a positive temperature coefficient into the gain of the amplifier ("Av"). As explained previously, this is achieved by selection of the ratio of resistances of 44 and 46.

In practice, "B" at the operate point requires a negative temperature coefficient to track the reduction in magnetic flux from commercial magnets as temperature increases. This is implemented in the present transducer by making the temperature coefficient of "Av" higher than would be necessary to just overcome the temperature coefficient of RHYST 38. Varying the ratio of 44 to 46 can yield either a positive or negative temperature coefficient. The ratio is first set to provide a positive temperature coefficient and secondly a value as will cause "Av" to track the combined temperature coefficients of the magnet and resistor 38.

TRIMMING FOR VARIATION IN THRESHOLD VOLTAGE CHIP TO CHIP

It is necessary for the voltage drop across the resistor 38 to be pre-set in the finished chip in order to condition the transducer to operate in response to a given magnetic field, such as one hundred (100) gauss, each time it is applied to the Hall cell 24. Offset voltages and other component irregularities can cause different voltage drops across resistor 38, chip to chip, unless some means is provided to compensate therefor. Variation of such voltage drops can result from photomask misalignment, thermal gradients, stress gradients, variation in Hall cell resistance, and other effects naturally resulting from processing. These are conjointly compensated for by adjusting the current, during the chip-fabrication process, through the resistor 38 to a value which will result in a drop of 25 mv across resistor 38.

The desired current adjustment is effected by means of the trimming network, which includes the transistors QT1, QT2, QT3, and QT4 and the associated emitter resistors 80, 82, 84, 86 connected to the negative voltage supply buss 28, as shown in FIG. 2. It will be noted that in series between each of these emitter resistors and the ground line 28 are individual fuses or links 90, 92, 94, and 96. All of the transistors QT1 through QTC are connected in parallel such that disconnecting one or more of them from the circuit will result in altering the available current to the emitters of the current-switching transistors Q15 through Q18. The transistors QT1 through QT4 can selectively be disconnected from the current-carrying circuit by blowing or otherwise disconnecting the associated link or links 90 through 96.

In a working embodiment, it is desired that the voltage drop across the resistor 38 for ambient temperature conditions of twenty-five (25) degrees centigrade be about twenty-five (25) millivolts, or more precisely 25.3 millivolts, when no magnetic field is applied to the Hall cell 24. In the integrated circuit chip, transistors QT1 through QT4 carry 15/16 unit of current. Transistor QT1 is ratioed to carry one-sixteenth (1/16) of the unit value, QT2 one-eighth (⅛), QT3 one-fourth (¼), and QT4 one-half (½). The transistor QTC is always in the circuit and has a current-carrying ratio of one-fourth (¼). Also, it should be noted that diode 30 carries a current sixteen (16) times that of QT1.

During the chip fabrication, once it is completed, it is probed and the voltage drop across the resistor 38 is measured. Depending on the value thereof, certain of the links 90 through 96 are blown by momentarily passing excessive current therethrough until a net current flowing through the transistor Q17 of the current-steering network produces a voltage drop of 25.3 millivolts across the resistor 38.

Of importance with respect to trimming is to compensate, as a first order effect, for the resistance of the Hall cell 24, which can vary widely from chip to chip for different production lots. Current through the Hall cell 24 depends upon the resistance thereof, which current is mirrored from the anode of the diode 30 to the bases of the transistors QT1 through QTC. Thus, the Hall cell 24 current ultimately determines the value of the current flowing through the collector of transistor Q17 and resistor 38 such that the trimming process just explained provides the necessary compensation for the Hall cell resistance variations. Once the trimming operation has been completed, the chip is calibrated for operation in response to one-hundred (100) gauss, for example, applied to the Hall cell 24.

GEOMETRIC LAYOUT TO MINIMIZE IMBALANCES

With reference to FIG. 7, the geometric layout in the integrated circuit chip of the amplifier Q1, Q2 is arranged to minimize inconsistency in output voltage. Such inconsistency can be caused by piezo-electric effects in stressing the silicon. It can be caused by photolithography if during processing the masks are not laid in proper registry. It can be caused by thermal gradients during chip operation, and when it is recognized that the output voltage of the Hall cell is in the order of millivolts, offset voltages due to any of these causes can have a substantial affect on circuit operation.

With respect to the amplifier Q1, Q2 as shown in FIG. 2, the composite transistor Q1 includes elemental transistors Q1A, Q1B, Q1C, and Q1D in parallel. Composite transistor Q2 consists of elemental transistors Q2A, Q2B, Q2C and Q2D, also in parallel. The elemental transistors are matched and hence they present common electrical characteristics. These transistors are physically laid out in the chip, as shown in FIG. 7, in a common centroid arrangement, in symmetrical quadrature relation about a central axis denoted by the reference numeral 98. The individual elemental transistors are arranged in pairs such that in one pair, for example, elemental transistors Q1A and Q2A are side by side and in another pair, elemental transistors Q1B and Q2B are side by side, etc.

Considering one of the elemental transistors, transistor Q2C for example, the layout of the collector, base, and emitter elements is indicated by the respective contacts 100, 102, and 104, respectively, spaced apart along an imaginary longitudinal axis 106 which is common with the axis of transistor Q1A. Transistors Q1C and Q2A are symmetrically spaced along axis 108, which is parallel to axis 106. Transistors Q1B and Q2D are similarly spaced, as are transistors Q2B and Q1D. Transistors Q1A and Q2A are side by side and Q2C and Q1C also side by side, etc. The remaining transistor pairs Q1B, Q2B and Q1D, Q2D are identically symmetrically arranged, but on the opposite sides of an imaginary square 110 defined by the four transistor pairs and the intersecting longitudinal axes thereof. The centroid axis 98 is at the center of the square 110 in the layout of the transistors Q1 and Q2, as well.

In compensating for the various effects which cause offset voltage, both sides Q1 and Q2 of the operational amplifier are fabricated such that parametric deviation occurs equally on both elemental transistors of each pair, such that in operation the operational amplifier Q1, Q2 will experience the same deviation in both of its sides, thereby inherently cancelling out the effect of the deviation. For example, considering the piezoelectric effect on the base emitter voltage of a transistor that occurs when the silicon is stressed, if the stress is uniform throughout the transducer chip or at least the region of the amplifier Q1, Q2, the composite transistors Q1, Q2 react the same in the circuitry. With the elemental transistors Q1A-Q1D and Q2A-Q2D interleaved in the centroid, paired arrangement, any gradient which the element Q1 transistors experience will also be experienced by the elemental Q2 transistors. Thus, in operation, these gradients balance out because of common mode rejection, since they appear concurrently on the two sides of the operational amplifier circuit.

Similarly, the resistors 34, 36, 38, and 40 in the collector circuits of the two transistors Q1 and Q2 are fabricated to be balanced, i.e., resistors 34 and 38 are matched and resistors 36 and 40 are also matched.

With respect to the Hall cell 24 itself, it is also made in the form of a composite of four identical Hall effect elements or plates A, B, C, and D, as shown in FIG. 7, these also being arranged in a quadrature, centroid configuration about the axis 112, closely packed and disposed immediately adjacent to the composite transistors Q1 and Q2. Since the elements are matched, a description of one will suffice for all. Considering element A, the general outline shape is rectangular with the elongated current contacts 114 and 116 disposed at the ends and symmetrically spaced along longitudinal axis 118, as shown, which intersects center 112, the current contacts being arranged perpendicular to the axis 118. The output voltage contacts 120 and 122 are centrally located on the opposite sides and spaced in a direction at right angles to axis 118, as shown. These contacts 120 and 122 are located in ear portions 124 and 126, respectively, of the Hall plate A, as shown, such that the contacts 120 and 122 will be essentially outboard of the current path between the current contacts 114 and 116. The Hall element C occupies the opposite quadrant of the quadrature layout with its longitudinal axis 118A being a straight line extension of axis 118. The other two elements B and D occupy the remaining opposite quadrants with the current axes coincident and passing through center 112.

In the circuit, the inner current contacts (such as contact 116 of element A) of all four elements are interconnected in parallel and the outer contacts are also connected together in parallel. The output voltage contacts are connected in parallel in such directions that tend to counteract the offset voltages of the Hall elements to minimize offset voltage at the output terminals of the composite Hall cell 24.

It will also be noticed that two additional Hall elements E and F matched to elements A, B, C, and D, but not electrically connected thereto, are disposed immediately adjacent to the four cells and to each other. These are also laid out in orthogonal relation. The current contacts are connected in series, thereby providing for the resistor 128, which serves a purpose later explained. The output contacts are not connected.

VOLTAGE REGULATOR

The voltage regulator section 16 of the transducer in FIG. 2 is that portion of the circuitry to the left of the Hall cell 24. Its primary function is to maintain a constant voltage as a source for the sensor circuitry, and especially for the Hall cell 24, even though the load current may change.

The transistor Q100 is series-connected at its collector to a resistor 133, which in turn is connected between the unregulated positive voltage buss 68 and negative voltage buss 28. PNP transistor Q102 and NPN transistor Q101 are connected in series, the emitter of transistor of Q101 being connected to the negative voltage buss 28 by means of parallel resistors 128 and 130. The resistor 128 consists of the two Hall effect elements E and F (FIG. 7) connected in series. The base of transistor Q100 and the emitter of transistor Q101 are connected together, and the resistors 128 and 130 are connected therebetween and the negative supply buss 28. The resistors 128 and 130 are of equal value; however, resistor 130 is a boron implant.

A PNP diode Q113 has its anode connected to the positive buss 26 and its cathode to the base of the transistor Q102 and also the emitter of PNP transistor Q112. The base of this latter transistor is connected to the collector of the transistor Q102 and the collector to substrate (as shown by the symbol at 145).

The base of the transistor Q102 is connected to the base of the NPN transistor Q103, the emitter of the latter being connected to the positive supply buss 26. The collector of this latter transistor is connected to the base of NPN transistor Q111, the collector being connected to the supply buss 68 and the emitter to the regulated voltage supply buss 26. Two PNP transistors Q104 and Q105 have the bases thereof connected together and the emitters connected to the regulated voltage supply buss 26. Both of these transistors have two collectors, connected as shown. Collector section A of transistor Q105 is connected to the base of a 2× PNP transistor Q109, the emitter thereof being connected to the cathode of the NPN diode Q110. Collector section B of Q105 is connected to the collector of transistor Q107 and the base of PNP transistor Q108. The emitter of this transistor is connected to the base of transistor Q109. The base of the NPN transistor Q107 is connected to the base of the NPN transistor Q106, which is of a 10× size, the collector of the latter being connected to the collector section B of transistor Q104. The emitter of transistors Q106 is connected to one end of two series-connected resistors 139 and 141 which have the other end connected to the negative voltage supply buss 28. The junction of these two resistors is connected to the emitter of the transistor Q107. A capacitor CC of 38 pf is connected between the base of the transistor Q108 and the negative voltage supply buss 28.

Two implant resistors 135 and 137 are series-connected between the positive voltage buss 26 and the negative voltage buss 28, the junction thereof being connected to the base of the transistor Q107.

The transistor Q111 essentially provides a constant voltage to buss 26, being series-connected between buss 68 and voltage buss 26. As the circuit current requirement changes, the voltage regulator 16 functions so as to change the bias on the base of transistor Q111 in a direction as will accommodate the changes.

The current load on the output circuit of the regulator, i.e., at the emitter of transistor Q111, can vary from chip to chip in different production lots due to processing variables as well as changes in ambient temperature. Also, the beta of the transistors vary with changes in ambient temperature and this requires load adjustment. This would normally be handled by using a Darlington connection for transistor Q111, but there is not adequate voltage "headroom" to accommodate the extra $V_{BE}$ drop and still maintain a regulator output voltage of 3.3 v with a $V_{cc}$ of 4.5 v.

The regulator is designed not only to provide current needs of the total circuit but also to conserve power such that the power supply does not need to be overdesigned for the purpose of handling worst case conditions. This is accomplished by automatically controlling the base current available to the transistor Q111 to supply the load current demand on the regulator line 26. The majority of the required current flows through Hall cell 24, and if one were to design for the worst case of low beta and low Hall cell 24 resistance for the various ranges of temperature that might be encountered, a substantial amount of current through transistor Q103 as a nominal value would have to be provided in order to have sufficient current for all of the worst case conditions.

The current requirements for the Hall cell 24 are sensed by the Hall resistor 128, which in the chip consists of the two Hall elements E and F (FIG. 7) connected in series. Since these two Hall elements E and F are immediately adjacent to the Hall elements A–D, they of course will experience essentially the same parametric conditions as the Hall elements A–D. Also during processing, the physical and electrical characteristics of the two Hall elements E and F will be made identical to those of the Hall elements A–D. It will be noted that the Hall elements E and F, as resistors 128, are connected between the emitter of transistor Q101 and negative buss 28. The bias for the transistor Q101 is derived from the collector of the transistor Q100. The currents through the Hall element resistor 128 and boron resistor 130 are mirrored to transistor Q103, and it is the current through this latter transistor which provides the control bias for the primary regulator transistor Q111.

It can be shown that a portion of the bias current for transistor Q103 is determined by the epitaxial resistivity of resistor 128, and further that the current through biasing transistor Q103 is determined by the base-emitter voltage of transistor Q100. The base-emitter voltage divided by the resistance of the two resistors 138 and 130 in parallel determines the current in bias transistor Q103. The nominal resistance of resistors 128 and 130 is 8.44 thousand ohms.

For a case in point, if it is assumed that in a given processing run a low epitaxial layer resistivity results, this will provide a low resistance Hall cell 24 (elements A–D). If these elements are low resistance, then it is also true that the Hall element resistor 128 will be of the same low resistance.

Since the Hall cell 24 constitutes the primary current load, and since the current through the Hall element resistor 128 is determined by the same resistivity characteristic, this latter current is mirrored via transistors Q102 and Q103 to provide additional base drive for the output transistor Q111. This then makes available in the regulated source more current for the sensing Hall cell 24 (elements A–D).

The bias circuit is designed to provide for the loss of current gain or beta as ambient temperature drops, while minimizing required total supply current. For example, for a temperature of minus 55 degrees centigrade, beta can become half of its room temperature value. In order to compensate for this loss, about two times as much base drive at such low temperatures would be required as would be needed at room temperature.

For such low temperatures, the current requirements for the Hall cell 24 (elements A–D) will increase and this is sensed by the compensating Hall element resistor 128. Because of the drop in resistance of resistor 128, current increases through the transistor Q102 and also Q101, and this is mirrored over to the transistor Q103, which has a current gain. This latter transistor supplies the base current for transistor Q111, which now becomes more conductive and supplies the additional current needed for the Hall cell 24 (elements A-D).

Figure 3:
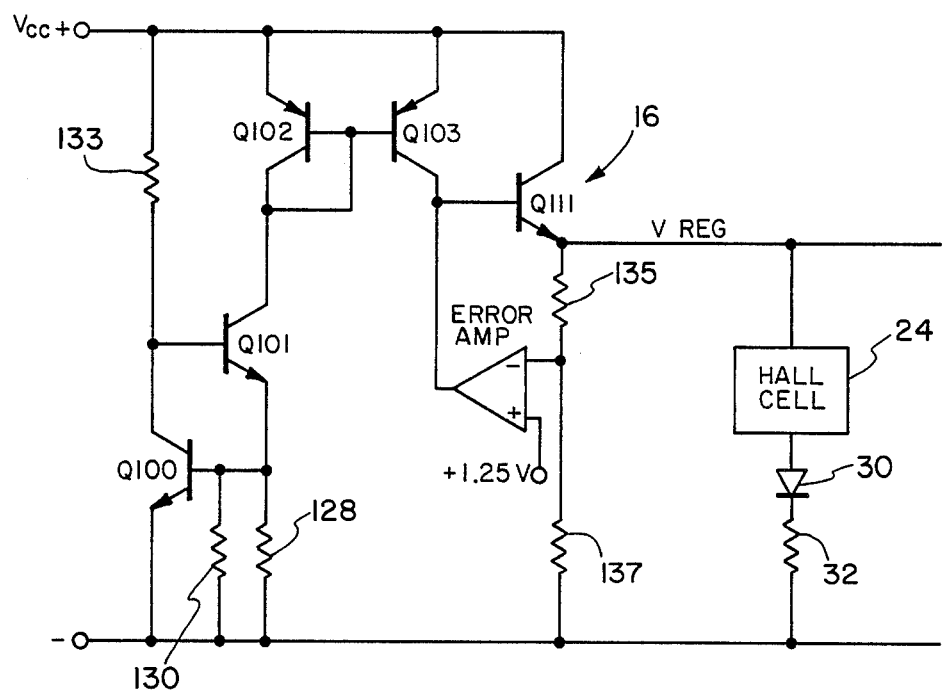
FIG. 3 is a simplified diagram of the voltage regulator section.

In further explanation, a simplified circuit diagram of the regulator is shown in FIG. 3. The error amplifier in a differential configuration has a reference voltage of, for example, 1.25 v.dc applied to the non-inverting input terminal. When the voltage at the junction of resistors 135 and 137 exceeds this value (meaning that for some reason the voltage on the positive voltage buss 26 has risen), the output voltage of the error amplifier drops, which is seen at the base of transistor Q111, causing its emitter voltage (buss 26) to drop correspondingly until a condition of balance appears at the inverting input terminal.

For an increase in ambient temperature, the Hall cell 24 increases in epitaxial resistance and requires less current for a given output voltage, assuming constant biasing voltage thereover. The epitaxial resistance of the auxiliary Hall elements 128 correspondingly changes at the same rate. The resistance of the paralleled boron implant resistor 130 also increases in resistance along with the other boron implant resistors of the transducer circuit that is effectively connected across the output voltage terminals 26–28 of the regulator. The effective resistance of the paralleled resistors 128 and 130 therefore depends upon the individual temperature coefficients. The base-emitter voltage (VBE) of Q100 drops, its temperature coefficient being −2 mv per degree centigrade. At the same time, beta of Q111 is increasing. Current through Q102 and Q101 now decreases, as does the current through the current mirror Q103. This results in less available current to drive the base of transistor Q111 and reduces available current at the emitter thereof (line 26). This reduction is in the proper direction, since the Hall cell 24 requires less current. Also, the remaining circuit implant resistances take less current, which is sensed by the diffused implant resistor 130. Thus, the voltage regulator circuit supplies current to the buss 26 as needed in order to maintain the voltage constant. Since the Hall cell 24 is composed of four Hall elements in parallel, it follows that the current demand therefor will be four times that of a single element. In the transducer circuit, about one-half of the current required is that of the Hall cell 24; hence, the importance of using the auxiliary Hall resistance 128 for sensing this current requirement.

By means of this novel circuit arrangement, the amount of drive available to transistor Q111 is in a sense proportional to the load which transistor Q111 is required to handle. This then avoids a circuit design which must provide in the first instance excessively high currents on a nominal basis to cover worst case conditions. This results in conserving power.

TEMPERATURE-COMPENSATED THRESHOLD

Figure 12:
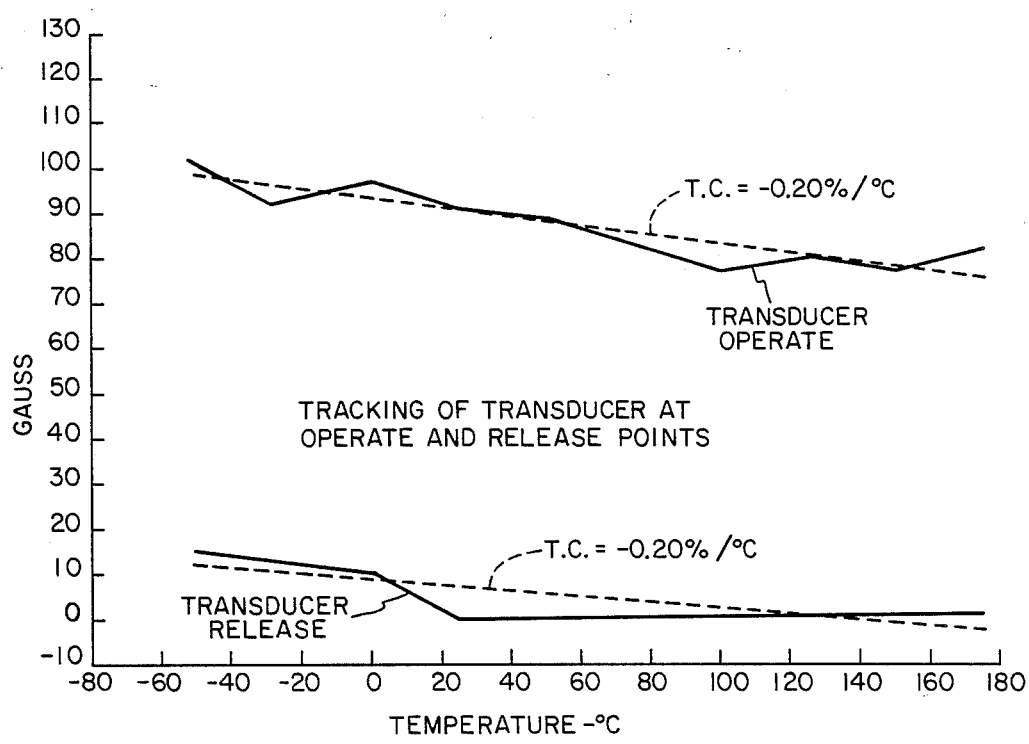
FIG. 12 is a graph showing transducer performance with temperature changes as compared with an assumed temperature coefficient of −0.020%/°C.

This transducer has been designed to allow its magnetic operate point (Bop) to track the nominal temperature coefficient of ferrite magnetic material, and nominally set for 100 gauss as indicated by the graph of FIG. 12. The temperature coefficient has been identified as −0.19%/degree C. The magnetic release point (Brp) has been designed to be zero (0) gauss.

For an N-type Hall cell:
$V_h$ is proportional to $(\mu_n)(V_s)(B)$, where:
  $V_h$ = Differential Hall Output Voltage
  $\mu_n$ = Electron Mobility
  $V_s$ = Hall Element Bias Voltage
  $B$ = Applied Magnetic Field.

Electron mobility falls sharply with increasing ambient temperature, reducing the differential Hall output voltage accordingly. The bias current through the Hall cell is proportional to the mobility, allowing the mobility to be tracked over temperature by monitoring bias current. The current through the Hall cell is also proportional to Vs, so anomalies in Vreg, due to temperature, may also be tracked by monitoring Hall element bias current. It is important to note that the combined effect of mobility and bias current variations, upon Hall sensitivity, negates the necessity for addressing these parameters separately. By making the comparator threshold voltage proportional to the Hall cell bias current and maintaining first amplifier gain constant, the magnetic sensitivity (magnetic operate point) will be maintained as a constant over ambient temperature variations.

The implementation of the above compensation techniques is achieved by using a current mirror with gain trimmable at wafer probe to cause a current proportional to the Hall cell bias current to flow through the threshold resistor 38. This resistor was selected to be fabricated from diffused boron, which has a positive temperature coefficient, causing the threshold voltage to increase with an increase in ambient temperature. Further, this temperature coefficient is compensated for by giving the first amplifier Q1, Q2 a positive temperature coefficient. Since the magnet field strength falls with increasing temperature, an even greater temperature coefficient has been designed into the first amplifier, so that the threshold voltage (magnetic operate point) tracks the varying magnet field strength over any ambient temperature change.

HIGH GAIN COMPARATOR

This transducer has been implemented utilizing a comparator 20 with two gain stages (35 times per stage). This approach allows for variation (due to process tolerances and ambient temperature variation) without affecting the magnetic operate and release points. A further attribute of this approach (high gain) assures that the output switches at the threshold points, not near the threshold points.

RECAPITULATION

The circuitry and physical layout in the chip is balanced so as to provide immunity against surges, transients, parametric changes due to temperature and stress gradients, and offset voltages due to various known causes resulting from processing as well as operation.

All of the amplifiers are balanced differential circuits so as to take advantage of the noise-immunizing feature inherent in common mode rejection.

Also, noise is suppressed by the delay circuit which employs the resistors 60, 62, and the capacitors QCAP1 and QCAP2.

The threshold resistor 38 placement is unique.

In the voltage regulator, the current demand of the Hall cell 24 is automatically provided and in a manner to conserve power. This in part is attributable to the two additional Hall elements E and F (FIG. 7) used as temperature-sensing resistor 128.

In the process of fabrication, irregularities introduced by mask misalignment and their effects on transducer performance are overcome by assuring that components, such as resistors, in the opposite sides of the balanced amplifiers are of equal value, thereby preserving the original objective of maintaining balanced conditions throughout.

Trimming is provided for chips of different production lots for the purpose of compensating for differences in resistivity, Hall cell-to-Hall cell. This is done in such a manner as to provide about a 25 millivolt drop across the threshold resistor 38. Process variations of the value of resistor 38 are also compensated for by this same trimming, since the ultimate adjustment lies in blowing links in the QT1-QTC circuit.

Temperature compensation for the changes in resistance of the resistor 38 and the strength of the actuating magnet is achieved by controlling the voltage gain of the amplifier Q1, Q2, this gain change being effected by a temperature-sensitive divider network which includes the resistors 44 and 46.

Temperature compensation for the change in output voltage of the Hall cell 24 is achieved by adjusting the threshold voltage across resistor 38 via current mirror QT1-QTC.

In the following are listed values of the discrete components not given previously. Such values are for a working embodiment of the invention, and are not to be considered as limiting but only as exemplary.

| Resistor | | ohms |
|---|---|---|
| 133 | | 100,000 |
| 135 | | 12,700 |
| 137 | | 7,290 |
| 32 | | 66 |
| 44 | | 7,540 |
| 46 | | 10,570 |
| 29, 31, 42, 48, 50, 64, 139 | | 2,000 |
| 80 | | 1,056 |
| 82 | | 528 |
| 84 | | 264 |
| 86 | | 132 |
| 88 | | 264 |
| 70 | | 8,650 |
| 72 | | 24,800 |
| 52, 54, 56, 58, 141 | | 10,000 |
| (Q201, Q203) degeneration | | 2,000 |
| 60, 62 | | 25,000 |
| 66 | | 1,250 |

All resistors are boron-doped implants having a sheet resistance of 2000 ohms per square, except resistors 32, 34, 38, and 80 through 88, which are diffused base of P-type conductivity.

Transistors are of equal size, except as hereafter noted.

| | |
|---|---|
| Q102 | 2x |
| Q106 | 10x |
| Q103 | 3x |
| Q109 | 2x |
| Q111 | 8x |
| Diode 30 | 16x |
| Q31, Q34, Q37 | 2x |
| Q212 | 16x |
| QT2 | 2x |
| QT3 | 4x |
| QT4 | 8x |
| QTC | 4x |
| Q15, Q18 | 3x |
| Q1, Q2 | 2x |

While there have been described above the principles of this invention in connection with a specific device, it is to be clearly understood that description is made only by way of example and not as limitation to the scope of the invention.

What is claimed is:

1. A magnetic sensing device performance stabilized against variations in ambient temperature, comprising:

a permanent magnet having a temperature coefficient according to which the strength of the magnetic field varies with changes in ambient temperature;

transducing means disposed in operative relationship to said magnet and responsive to said field for generating a signal representative of a predetermined strength thereof;

said transducing means having a temperature coefficient whereby its field response in generating said signal also varies with changes in ambient temperature;

said temperature coefficients substantially tracking within a given range of temperatures whereby the response characteristic of said transducing means in generating said signal varies in accordance with changes in said predetermined strength as ambient temperature changes within said range.

2. The magnetic sensing device of claim 1, wherein the strength of said field of said magnet as applied to said transducing means is selectively variable between first and second operating levels, said first level corresponding to said predetermined strength and said transducing means being responsive to both levels to generate different first and second signals representative thereof;

said temperature coefficients substantially tracking for the operating conditions corresponding to said first level.

3. The magnetic sensing device of claim 2, wherein said magnet and transducing means are relatively movable to positions which provide applied field strengths to said transducing means according to said first and second levels, respectively.

4. The magnetic sensing device of claim 3, wherein said magnet has a pole which is movable relative to said transducing means between first and second positions, said first position being proximate to said transducing means a given distance therefrom, said second position being remote a given distance therefrom, said first and second levels of applied field strength corresponding to said first and second pole positions, whereby said transducing means generates, respectively, said first and second representative signals each time said pole is moved to said first and second positions irrespective of ambient temperature within said range of temperatures.

5. The device of claim 4, wherein said magnet includes permanent magnet ferrite powder in a solidified body of plastic, and said transducing means is a monolithic integrated circuit formed within a body including semiconductive material.

6. The device of claim 5, wherein said integrated circuit is in the form of a planar multilayer chip, and comprises a Hall cell;

amplifier means connected to said Hall cell for providing an output signal of two different magnitudes in response to and representative of the applied magnetic fields of said first and second magnet positions, respectively, voltage comparator means having a threshold voltage and coupled to said amplifier means for producing two distinctly different output signals in response to said representative signals, respectively;

threshold voltage-determining means coupled between said amplifier means and said comparator means for determining the magnitudes of the representative signals at which said comparator means produces said distinctly different output signals, and voltage regulator means for supplying a substantially constant DC voltage to said Hall cell, to said amplifier means and to said comparator means.

7. The device of claim 6, wherein said amplifier means has a positive temperature coefficient such that with increased temperature the gain thereof increases, biasing resistor means having a temperature coefficient connected between said voltage regulator means and said amplifier means for controlling the gain of the latter in response to temperature change in the direction of increasing such gain with increasing temperature.

8. The device of claim 7, wherein the resistance of said Hall cell has a positive temperature coefficient such that with increased temperature the output voltage thereof reduces, said biasing resistor means further controlling the gain of said amplifier means in an increasing direction for a temperature increase to an extent that the magnitudes of said representative output signals of said amplifier means will equal the magnitudes as determined by said threshold voltage-determining means.

9. The device of claim 8, wherein said amplifier means comprises a differential amplifier having a pair of transistors, the bases thereof being coupled to said Hall cell, the emitters being connected together and to one side of said voltage regulator means by means of a current sink transistor, the collectors of said transistor pair being connected to the other side of said voltage regulator means by means of two resistances, respectively, circuit means connecting said biasing resistor means to said current sink transistor for controlling the current therethrough and hence the gain of said differential amplifier.

10. The device of claim 8, wherein said threshold voltage-determining means has a negative temperature coefficient whereby an increase in ambient temperature causes a decrease in the threshold voltage of said comparator means.

11. The device of claim 9, wherein said threshold voltage-determining means includes a first threshold voltage resistor included in one of said two collector resistances, said threshold voltage resistor being coupled between the respective collector and said other side of said voltage regulator means;
a current sink transistor coupled in series between said threshold resistor and said one side of said voltage regulator means, and current mirror biasing means connected between said Hall cell and the last-mentioned current sink and operative to alter the current through the latter according to current flow through said Hall cell.

12. The device of claim 11, wherein said threshold voltage-determining means includes a current-switching network connected in series with said threshold voltage resistor and said last-mentioned current sink said voltage comparator means having input and output circuits;
said input circuit being connected to said threshold resistor;
said output circuit being connected to said current-switching network;
said current-switching network being responsive to individual ones of said two different output signals of said voltage comparator means to in one instance provide current flow through said threshold resistor and in another instance to interrupt such current flow.

13. The device of claim 12, wherein said voltage comparator means includes two stages of differential amplifiers in a high gain configuration;
said current-switching network including a transistor having its collector and emitter in series between said threshold resistor and said last-mentioned current sink;
biasing circuit means connecting the base of the last-mentioned transistor to the output circuit of said voltage comparator means in such relation that as one of the output signals of the latter changes magnitude from higher to lower said last-mentioned transistor is biased to become less conductive toward a condition of interrupting said current flow as aforesaid.

14. The device of claim 4, wherein said transducing means includes an integrated circuit in the form of a planar multilayer chip and further comprises a Hall cell;
amplifier means connected to said Hall cell for amplifying the output voltage thereof for providing an output signal of two different magnitudes in response to and representative of the applied magnetic fields of said first and second magnet positions, respectively;
said amplifier means including a differential amplifier having two sides which include matched transistors, each side including at least two matched transistors connected in parallel, said transistors being symmetrically arranged in pairs in relation to a reference point, the transistors in each pair being juxtaposed immediately adjacent to each other and composed of one transistor from each of said sides.

15. The device of claim 14, wherein the two sides of said differential amplifier each include four matched transistors, the transistors in each side being connected in parallel, said transistors being arranged in pairs, the transistors in each pair being juxtaposed immediately adjacent to each other and composed of one transistor from each of said sides, and said pairs being disposed immediately adjacent to each other and symmetrically arranged in quadrature relation about said reference point.

16. The device of claim 15, wherein said differential amplifier further includes two matched resistor branches formed in the chip, each branch including two resistors connected in series, one end of each branch being connected to the collectors of the transistors of one side;
the two resistors of each branch being of different resistances, the higher value resistors being directly connected to the respective collectors;
the lower value resistors being disposed immediately adjacent to each other and the higher value resistors being disposed immediately adjacent to each other.

17. The device of claim 4, wherein said transducing means includes an integrated circuit in the form of a planar multilayer chip and further comprises a Hall cell which includes a sensing Hall element in one layer thereof;
said sensing Hall element having current and voltage contacts, and a matched auxiliary Hall element immediately adjacent to said sensing Hall element;

voltage regulator means for supplying a substantially constant DC voltage to the biasing contacts of said sensing Hall element;

said voltage regulator means including said auxiliary Hall element and a current-regulating circuit responsive to changes in resistance of said auxiliary Hall element due to changes in ambient temperature for providing current at a level that tracks the operating current required by said sensing Hall element as its resistance changes due to the same ambient temperature changes.

18. The device of claim 6, wherein said amplifier means includes a differential amplifier having two sides which include matched transistors;

at least one of said transistors being in each of said sides;

each side also including two resistors in series between the collector of the respective transistor and one side of said voltage regulator means;

one resistor of each of said two resistors being a load resistor and connected to the respective collector, the load resistor having a resistance higher than the resistor connected thereto, the resistors in the two sides being matched;

said threshold voltage-determining means including one of said other resistors which serves as a threshold voltage resistor, a current sink transistor having its collector conductively connected to said threshold resistor at the junction with its load resistor and its emitter conductively connected to the other side of said voltage regulator means;

and biasing circuit means connected between said Hall cell and the base of said current sink transistor for altering the conductivity of the latter according to the biasing current through said Hall cell thereby to control the level of current through said threshold resistor.

19. The device of claim 18, including at least two of said current sink transistors connected in parallel;

each current sink transistor having its emitter connected to said other side of said voltage regulator means by means of a conductive fuse-type link whereby the blowing of one link serves to alter the value of current through said threshold voltage resistor.

20. The device of claim 19, including five current sink transistors connected in parallel, four of said transistors having said links conductively connecting the emitters thereof to said other side of said voltage regulator means, said four transistors being formed in certain of the layers of said chip and being of different current-conducting size, the largest being eight times the size of the smallest, one being four times, and another two times, whereby severing selected ones of said links serves to determine the magnitude of current flow through said threshold voltage resistor.

21. The device of claim 12, wherein said current-switching network comprises a transistor having its collector and emitter connected in series between said threshold voltage resistor and said current sink, the base thereof being connected to said output circuit of said voltage comparator means.

22. The device of claim 21, wherein said output circuit of said voltage comparator means includes two output conductors across which appear said two output signals of said voltage comparator means, one output signal which corresponds to one of said amplifier representative signals providing a first difference voltage between said two conductors and the other output signal which corresponds to the other of said representative signals providing a second difference voltage of opposite sense between said two conductors;

said threshold voltage-determining means including a second threshold voltage resistor in the other of said two collector resistances of said amplifier means, said second threshold voltage resistor being connected between the respective collector of said amplifier means and said other side of said voltage regulator means;

said current-switching network comprising two matched transistors, the emitters being connected together and to said current sink, the collectors being individually series-connected to said first and second threshold voltage resistors, respectively, thereby providing separate current paths through said threshold voltage resistors and the resistors connected thereto, the bases of said current-switching transistors being connected, respectively, to said two conductors whereby the first difference voltage thereon renders one of said two current-switching transistors conductive and the other non-conductive and the second difference voltage renders said one transistor non-conductive and the other conductive.

23. The device of claim 12, wherein said voltage comparator means includes two stages of differential amplifiers in a high gain configuration;

each stage having two sides which include matched transistors, there being one transistor in each side, the collectors being conductively connected to said other side of said voltage regulator means, the emitters of one stage being connected together and to the collector of a first current sink transistor, the emitter of the current sink transistor being connected to said one side of said voltage regulator means, the emitters of the other stage being connected together and to the collector of a second current sink transistor, the emitter of said second current sink transistor being connected to said one side of said voltage regulator means;

the bases of the two transistors of said one stage being coupled to said threshold voltage resistor, the two bases of the two transistors of the other stage being coupled to the two collectors, respectively, of the two transistors of said one stage;

the bases of the two current sink transistors being connected together, a positive temperature coefficient biasing circuit connecting the last-mentioned bases to said voltage regulator means for providing a biasing voltage thereto.

24. The device of claim 17, wherein said Hall cell includes four matched planar Hall elements in the epitaxial layer of said chip, said four Hall elements being symmetrically arranged in quadrature relationship about a common point and closely spaced, the current contacts of each element being spaced and defining therebetween a current axis, the voltage contacts being spaced and disposed on opposite sides of said current axis, said four elements being arranged in two pairs, the current axes of the two elements of each pair being coincident and orthogonally intersecting, said four elements being electrically connected in parallel;

two auxiliary planar Hall elements in said epitaxial layer matched to each other and to said four Hall elements, said auxiliary Hall elements being orthogonally arranged symmetrically in juxtaposed relationship immediately adjacent to said four Hall elements, the current contacts of the auxiliary Hall elements being connected in series.

25. An integrated circuit transducing device comprising a Hall cell which produces first and second output voltages corresponding to two different levels of applied magnetic fields, respectively;
   first amplifier means connected to said Hall cell responsive to said first and second voltages for producing corresponding first and second signals, respectively;
   threshold voltage means operable to produce a threshold voltage when enabled and no threshold voltage when disabled;
   second amplifier means connected to said first amplifier means and to said threshold voltage means responsive to the combination of said first signal and said threshold voltage for generating a third signal and to said second signal and the absence of said threshold voltage for generating a fourth signal;
   switching means connected to said threshold voltage means and to said second amplifier means responsive to said third signal for enabling said threshold voltage means and to said fourth signal for disabling said threshold voltage means; and
   circuit means connected to said second amplifier means for producing output switching signals in response to said third and fourth signals.

26. The device of claim 25, wherein said first amplifier means has an output circuit for providing said first and second signals;
   said threshold voltage means including a voltage-generating source in circuit with said output circuit for providing said threshold voltage, whereby said threshold voltage may be selectively combined with said first signal.

27. The device of claim 26, including means for controlling the gain of said first amplifier means according to variations in ambient temperature;
   said voltage-generating source having a temperature coefficient whereby said threshold voltage varies with changes in said ambient temperature;
   said gain-controlling means having a temperature coefficient related to said source temperature coefficient such that said first and second signals maintain said threshold voltage as temperature changes.

28. The device of claim 27, including biasing circuit means connecting said Hall cell to said threshold voltage means and responsive to changes in the operating characteristics of said Hall cell due to changes in ambient temperature for correspondingly altering said threshold voltage.

29. The device of claim 25, including a source of supply voltage, said first amplifier means including a first differential amplifier having two transistors in the opposite sides thereof, each transistor having a load resistance in series therewith, each transistor and its load resistance being coupled across said source of voltage, the bases of said transistors being connected to said Hall cell;
   said threshold voltage means including a part of one of said load resistances to serve as a threshold voltage resistor;
   said switching means being connected in series with said threshold voltage resistor and this series circuit being connected across said source of voltage, thereby selectively connecting said threshold voltage resistor across said source, said threshold voltage resistor producing said threshold voltage when current passes therethrough;
   said first and second signals of said first amplifier means being in the form of unidirectional voltages appearing at the connection of said one load resistance to the respective transistor, said connection thereby serving as an output circuit, said threshold resistor being between said source and the remaining part of said one load resistance whereby the voltage drop appearing across said threshold resistor is applied to said output circuit.

30. The device of claim 29, including means for controlling the gain of said first amplifier means according to variations in ambient temperature, said threshold resistor having a positive temperature coefficient, said gain-controlling means having a temperature coefficient related to the temperature coefficient of said threshold voltage resistor such that the unidirectional voltage at said connection tracks said threshold voltage with temperature change, and circuit means connecting said Hall cell to said threshold voltage resistor to vary the current through the latter in accordance with variations in bias current through said Hall cell.

31. The device of claim 30, wherein said switching means includes a first switching transistor having its emitter and collector in series with said threshold voltage resistor;
   said second amplifier means having an output circuit which provides said third and fourth signals, said third and fourth signals being unidirectional, the base of said switching transistor being connected to the last-mentioned output circuit and responsive to said third signal to render said switching transistor conductive and to said fourth signal to render it non-conductive.

32. The device of claim 31, wherein said first amplifier means includes a current sink connected between said two transistors and said source, said current sink including a transistor;
   said means for controlling the gain of said first amplifier means including
   biasing resistor means having a temperature coefficient connected to the base of the current sink transistor for controlling the gain of said differential amplifier in response to temperature changes in the direction of increasing such gain with increasing temperature.

33. The device of claim 32, wherein said two transistors of said differential amplifier are matched and the load resistances are also matched, the collectors being connected to the load resistances, respectively, the emitters being connected together and to the collector of said current sink transistor;
   each load resistance being divided into two series-connected parts, one a load resistor and the other a threshold voltage resistor, the ratio of resistance between the load resistor and its threshold voltage resistor being about one hundred to one;
   said second amplifier means including two cascaded stages of differential amplifiers in a high gain configuration, each stage including two matched transistors, the bases of the transistors of the first stage being coupled to the collectors of said two transistors of said first differential amplifiers, the collectors of the transistors of the second stage constituting the output circuit of said second amplifier means;

the collectors of each of both stages having two diodes connected therebetween in back-to-back relation;

said switching means being of differential amplifier configuration and including said first transistor and a second matching switching transistor, the collectors of said switching transistors being connected to the junctions of the threshold voltage and load resistors, respectively, the emitters of said switching transistors being connected via a second current sink transistor to said voltage source, the base of the latter transistor being connected into a current mirror network having a connection to said Hall cell in current-sensing relation; and said voltage source being a regulated voltage supply.

34. The device of claim 33, including four second current sink transistors having their bases and collectors in parallel, the emitter of each second current sink transistor being connected to one side of said voltage supply by means of a respective fusible link whereby severing selected ones of said links serves to determine the magnitude of current through one of said threshold voltage resistors.

35. The device of claim 34, including an output driver circuit having an input circuit and an output switching terminal, a signal delay circuit connected between the output circuit of said second amplifier means and the input circuit of said driver circuit whereby the third and fourth signals are delayed in being coupled to said input circuit.

36. The device of claim 25, in the form of a planar monolithic chip including voltage regulator means for supplying a substantially constant voltage to said Hall cell, to said first and second amplifier means, to said threshold voltage means, to said switching means and to said circuit means;

said Hall cell including a planar sensing Hall element, a matched planar auxiliary Hall element immediately adjacent to said sensing Hall element, the biasing contacts of said sensing Hall element being connected to said voltage regulator means;

said voltage regulator means including said auxiliary Hall element and a current-regulating circuit responsive to changes in resistance of said auxiliary Hall element due to changes in ambient temperature for providing current at a level that substantially maintain the biasing current required by said sensing Hall element as its resistance changes due to the same ambient temperature changes.

37. The device of claim 36, including four matched planar sensing Hall elements symmetrically arranged in quadrature relationship about a common point and closely spaced, said four elements being connected in parallel, there being two matched auxiliary planar Hall elements matched also to said four Hall elements and orthogonally arranged symmetrically immediately adjacent to said four Hall elements with the current contacts thereof in series, and a resistor having a resistance substantially equal to that of the two series-connected auxiliary Hall elements and connected in parallel therewith.

38. A silicon integrated circuit chip comprising a semiconductor substrate of one conductivity type, an epitaxial layer of the opposite conductivity type superposed on said substrate, two matched Hall elements in said epitaxial layer immediately adjacent to each other, one of said Hall elements serving as a sensor and being connected to amplifier circuit means which amplifies the output voltage thereof, voltage regulator means connected to said sensing Hall element and said amplifier circuit means for applying a regulated supply voltage thereto, said voltage regulator means including the other of said Hall elements, and a current-regulating circuit responsive to changes in resistance of said other Hall element due to changes in ambient temperature for providing current at a level that substantially maintains the biasing current required by said sensing Hall element as its resistance changes due to the same ambient temperature changes.

39. The chip of claim 38, including four matched planar sensing Hall elements symmetrically arranged in quadrature relationship about a common point and closely spaced, said four elements being connected in parallel, and two of said other Hall elements matched to said sensing Hall elements and orthogonally arranged symmetrically immediately adjacent to said sensing Hall elements, with the current contacts of said other Hall elements being in series.

40. A magnetic sensing device comprising an integrated circuit transducing means responsive to two different strengths of an applied magnetic field for changing state between operate and release conditions, respectively, and for producing two signals representative thereof, a permanent magnet operatively associated with said transducing means for movement between first and second positions relative to said transducing means at which said fields of two different strengths, respectively, are applied to said transducing means, said transducing means being in operate state when said magnet is in said first position and in release state when said magnet is in said second position, both said magnet and said transducing means having temperature coefficients which substantially track at the operate state of said transducing means and the first position of said magnet for changes in ambient temperature within a predetermined range of temperatures.

41. A Hall-type transducing device comprising an integrated circuit responsive to two different strengths of an applied magnetic field for changing state between operate and release conditions and for producing two signals, respectively, representative thereof, magnet means for selectively applying a variable strength magnetic field including said two different strengths to said integrated circuit, said integrated circuit having a sensitivity for said operate condition that varies with changes in ambient temperature, said magnet means having a temperature coefficient whereby the field produced thereby varies with changes in ambient temperature, said sensitivity of said integrated circuit varying with temperature according to a relations that causes a change of state of said transducing means to said operate condition at all ambient temperatures within a predetermined range of temperatures, said sensitivity further tracking said field strength at substantially the same rate of change for variations in said ambient temperature.

42. The device of claim 4, wherein said transducing means includes an integrated circuit which further comprises a Hall cell, amplifier means connected to said Hall cell for providing an output signal of two different magnitudes in response to and representative of the applied magnetic fields of said first and second magnet positions, respectively, voltage comparator means having a threshold voltage and coupled to said amplifier means for producing two distinctly different output signals in response to said representative signals, respectively, and threshold voltage-determining means coupled between said amplifier means and said comparator means for determining the magnitudes of the representative signals at which said comparator means produces said distinctly different output signals.

43. A magnet having at least one magnetic pole, transducing means for generating an electrical signal in response to a magnetic field of predetermined strength, said magnet being movable relative to said transducing means for juxtaposing said pole a given distance from said transducing means at which said predetermined strength field is applied to said transducing means, both said magnet and said transducing means having temperature coefficients which substantially track over a given range of temperatures such that said transducing means always generates said signal for different temperatures within said range when said magnet pole is said given distance therefrom.

* * * * *

UNITED STATES PATENT AND TRADEMARK OFFICE
CERTIFICATE OF CORRECTION

PATENT NO. : 4,908,527

DATED : March 13, 1990

INVENTOR(S) : Joel C. Van Antwerp

It is certified that error appears in the above-identified patent and that said Letters Patent is hereby corrected as shown below:

Column 1, line 23, after "therefrom" insert --,--.

line 63, delete "charge" and insert --change--.

Column 2, line 45, delete "FIGS. 2A, 2B, 2C, and 2D are circuit diagrams" and insert --FIG.2 (which includes FIGS. 2A, 2B, 2C, and 2D) is a circuit diagram--.

line 61, delete "8-of" and insert 8-8 of--.

Column 3, line 3, delete "-0.020%°C;" and insert -- -.020%/°C;--.

line 20, delete "FIG. 1" and insert --FIG. 2--.

Column 4, line 37, after "this" insert --diode is connected to the negative voltage buss 28 by--.

Column 14, line 5, delete "impdeance" and insert --impedance--.

Column 25, line 32, after " "29, 31, 42, 48, " delete " 2,000" ".

line 33, after " 50, 64, 139 " insert --2,000 "--.

line 40, after " "52, 54, 56, " delete " 10,000 " ".

UNITED STATES PATENT AND TRADEMARK OFFICE
CERTIFICATE OF CORRECTION

PATENT NO. : 4,908,527

DATED : March 13, 1990

INVENTOR(S) : Joel C. Van Antwerp

It is certified that error appears in the above-identified patent and that said Letters Patent is hereby corrected as shown below:

Column 15, line 41, after " 58, 141 ", insert --10,000 "--.

Signed and Sealed this

Twelfth Day of November, 1991

*Attest:*

HARRY F. MANBECK, JR.

*Attesting Officer*  *Commissioner of Patents and Trademarks*